United States Patent
Tsukuda et al.

(10) Patent No.: US 12,306,342 B2
(45) Date of Patent: May 20, 2025

(54) OPTICAL DETECTION DEVICE AND ELECTRONIC APPARATUS

(71) Applicant: Sony Semiconductor Solutions Corporation, Kanagawa (JP)

(72) Inventors: Yasunori Tsukuda, Kanagawa (JP); Shohei Shimada, Kanagawa (JP); Yannick Baines, Tokyo (JP); Takeshi Matsunuma, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/683,631

(22) PCT Filed: Sep. 29, 2022

(86) PCT No.: PCT/JP2022/036499
§ 371 (c)(1),
(2) Date: Feb. 14, 2024

(87) PCT Pub. No.: WO2023/058556
PCT Pub. Date: Apr. 13, 2023

(65) Prior Publication Data
US 2024/0385294 A1   Nov. 21, 2024

(30) Foreign Application Priority Data

Oct. 5, 2021   (JP) .................... 2021-164180

(51) Int. Cl.
*G01S 7/481* (2006.01)
*G01S 7/4865* (2020.01)
*G01S 17/10* (2020.01)

(52) U.S. Cl.
CPC .......... *G01S 7/4816* (2013.01); *G01S 7/4865* (2013.01); *G01S 17/10* (2013.01)

(58) Field of Classification Search
CPC ....... G01S 7/4816; G01S 7/4865; G01S 17/10
See application file for complete search history.

(56) References Cited

U.S. PATENT DOCUMENTS

| 2019/0257688 | A1* | 8/2019 | Balamurugan | ....... G01J 1/0252 |
| 2020/0128203 | A1* | 4/2020 | Hirono | ................... H04N 25/77 |

FOREIGN PATENT DOCUMENTS

| JP | 2018201015 A | 12/2018 |
| JP | 2019075394 A | 5/2019 |
| JP | 2021056016 A | 4/2021 |

OTHER PUBLICATIONS

International Search Report (PCT/ISA/210), International Application No. PCT/JP2022/036499, dated Nov. 29, 2022.

* cited by examiner

*Primary Examiner* — Thanh Luu
(74) *Attorney, Agent, or Firm* — Michael Best & Friedrich LLP

(57) ABSTRACT

Optical detection devices wherein a bias voltage of a photoelectric conversion element is accurately adjustable regardless of a quantity of incident light are disclosed. In one example, an optical detection device includes a first pixel that has a photoelectric conversion element for generating a carrier by photoelectric conversion, a second pixel that has a carrier generation unit for generating a carrier by a cause other than photoelectric conversion, and a control circuit that controls a bias voltage applied to each of the photoelectric conversion element and the carrier generation unit, according to the carrier generated by the second pixel. The photoelectric conversion element includes a first photoelectric conversion region and a first pinning film disposed at a position in contact with the first photoelectric conversion region. The carrier generation unit includes a second photoelectric conversion region, and includes a second pinning film that is partially removed.

26 Claims, 30 Drawing Sheets

INCIDENT LIGHT

INCIDENT LIGHT

INCIDENT LIGHT

OPTICAL DETECTION DEVICE AND ELECTRONIC APPARATUS

TECHNICAL FIELD

The present disclosure relates to an optical detection device and an electronic apparatus.

BACKGROUND ART

Some types of detection use a SPAD (Single Photon Avalanche Diode) to accurately detect weak light. The SPAD is widely adopted for a ToF (Time of Flight) sensor and the like. The SPAD detects light in a state where a reverse bias voltage equivalent to or higher than a breakdown voltage is applied between an anode and a cathode of the SPAD. When light is detected, cathode potential of the SPAD drastically lowers. Once the cathode potential of the SPAD lowers to bottom potential (also called a quench voltage), light is not re-detectable until subsequent recovery to the original voltage level is completed. The bottom potential of the SPAD varies according to temperature or other factors, and influences sensitivity of the SPAD as well. The bottom potential of the SPAD is variably controllable by adjustment of a bias voltage, such as cathode potential, of the SPAD.

Accordingly, there has been disclosed such a technology which provides a SPAD for monitoring separately from a SPAD for generating a pixel signal, to detect the bottom potential described above by using the SPAD for monitoring, and adjusts a bias voltage of the SPAD in reference to the detected bottom potential (see PTL 1).

CITATION LIST

Patent Literature

[PTL 1]
Japanese Patent Laid-open No. 2021-056016

SUMMARY

Technical Problem

In PTL 1, light is introduced into a SPAD for monitoring from the outside, and bottom potential is detected. As described above, the bottom potential varies according to temperature or the like. Accordingly, in PTL 1, the bottom potential is measured a plurality of times, and processing for averaging the bottom potential of each of the respective measurements to increase accuracy of a bias voltage is performed.

However, in a case where the quantity of light entering the SPAD for monitoring is insufficient, the measurements are easily influenced by noise light. Even if the averaging process is performed, variations of the bottom potential with time increase. In this case, variations of PDE (Photon Detection Efficiency) with time also increase.

Accordingly, the present disclosure provides an optical detection device and an electronic apparatus capable of accurately adjusting the bias voltage of a photoelectric conversion element regardless of the quantity of incident light.

Solution to Problem

For solving the abovementioned problems, the present disclosure provides an optical detection device including a first pixel that has a photoelectric conversion element for generating a carrier by photoelectric conversion, a second pixel that has a carrier generation unit for generating a carrier by a cause other than photoelectric conversion, and a control circuit that controls a bias voltage applied to each of the photoelectric conversion element and the carrier generation unit, according to the carrier generated by the second pixel, in which the photoelectric conversion element includes a first photoelectric conversion region in which photoelectric conversion is possible, and a first pinning film disposed at a position in contact with the first photoelectric conversion region, and the carrier generation unit includes a second photoelectric conversion region in which photoelectric conversion is possible, and includes a second pinning film that is partially removed, at a position in contact with the second photoelectric conversion region, or no member that reduces dark current, in an entire area of the second photoelectric conversion region.

The second pinning film may be partially removed from at least either a surface side opposite to a wiring region of the carrier generation unit or a boundary region with an adjacent pixel.

The carrier generation unit may generate the carrier by an interface state produced inside the second photoelectric conversion region.

A light shielding member that shields entrance of light into the second pixel may be provided.

A material of the light shielding member may contain a material identical to a material of a pixel separator that is disposed in a boundary region of the second pixel and that shields light coming from an adjacent pixel.

An on-chip lens that converges light to the first pixel and a light emission element that emits light may be provided. The second pixel may be disposed at a position different from a region through which light emitted from the light emission element passes and a region through which light transmitted through the on-chip lens passes.

A support that supports the first pixel, the second pixel, the on-chip lens, and the light emission element may be provided. A part of the support may function as the light shielding member.

The carrier generation unit may have a P-region and an N-region joined to each other. The carrier generation unit may cause a breakdown when the carrier is generated in a state where a potential difference corresponding to the bias voltage is given between the P-region and the N-region.

A readout circuit that generates a pixel signal corresponding to the carrier generated by the second pixel may be provided. The control circuit may control the bias voltage according to a potential level of the pixel signal.

A count circuit that counts the number of times the carrier generation unit has caused a breakdown and a number of times comparison and determination circuit that determines whether or not the number of times counted by the count circuit has reached a predetermined reference number of times and changes an operation condition for the second pixel according to a determination that the counted number of times has reached the reference number of times may be provided.

The number of times comparison and determination circuit may control the potential difference to prevent a breakdown of the carrier generation unit when the counted number of times has reached the reference number of times.

The control circuit, the readout circuit, the count circuit, and the number of times comparison and determination circuit may be provided for each unit of the second pixel or a plurality of the second pixels.

The control circuit, the readout circuit, the count circuit, and the number of times comparison and determination circuit may be disposed on a substrate identical to a substrate where the first pixel and the second pixel are disposed.

A first substrate where the first pixel and the second pixel are disposed and a second substrate where at least some of the control circuit, the readout circuit, the count circuit, and the number of times comparison and determination circuit are disposed may be provided. The first substrate and the second substrate may be laminated and joined by a conductive member to perform signal transfer between each other.

A pixel array unit that has a plurality of the first pixels and a plurality of the second pixels may be provided. The plurality of first and second pixels may be provided such that each of the plurality of first pixels is associated with any one of the second pixels, that each of the second pixels is associated with any two or more of the first pixels, or that each of the first pixels is associated with any two or more of the second pixels.

The pixel array unit may be formed such that the pixel array unit includes a first pixel region where the plurality of first pixels are disposed and a second pixel region where the plurality of second pixels are disposed, that the plurality of second pixels are disposed within a pixel region where the plurality of first pixels are disposed, or that the plurality of first pixels are disposed within a pixel region where the plurality of second pixels are disposed.

The present disclosure provides an optical detection device including a first pixel that has a photoelectric conversion element for generating a carrier by photoelectric conversion, a second pixel that has a carrier generation unit different from the photoelectric conversion element in structure for generating a carrier, and a control circuit that controls a bias voltage applied to each of the photoelectric conversion element and the carrier generation unit, according to the carrier generated by the second pixel.

The photoelectric conversion element may have a first photoelectric conversion region in which photoelectric conversion is possible. The carrier generation unit may have a second photoelectric conversion region in which photoelectric conversion is possible. The second photoelectric conversion region may have a carrier generation source that generates the carrier by a cause other than entrance of light.

The carrier generation source may include a diffusion region in a floating state that is disposed inside the second photoelectric conversion region and that has a higher impurity concentration than the second photoelectric conversion region.

The carrier generation source may include at least either a crystal defect portion or a heavy metal existing portion inside the second photoelectric conversion region.

The carrier generation source may include a portion obtained by partially removing a surface of the second photoelectric conversion region.

The carrier generation source may include a conductive member that is in a floating state and is connected to the second photoelectric conversion region.

The carrier generation unit may have a stress applying member that applies stress to the second photoelectric conversion region. The carrier generation source may include a portion distorted by the stress applied from the stress applying member within the second photoelectric conversion region.

The carrier generation unit may have a transistor disposed in the second photoelectric conversion region. The carrier generation source may generate the carrier by controlling a gate voltage of the transistor.

The carrier generation unit may have an electrode connected to the second photoelectric conversion region. The carrier generation source may generate the carrier by applying a predetermined voltage to the electrode.

The second photoelectric conversion region may have a plurality of diffusion layers disposed with a distance left between each other in a plane direction. The carrier generation source may generate the carrier that moves between the plurality of diffusion layers, by giving a potential difference between the plurality of diffusion layers.

The carrier generation unit may include a first semiconductor layer of a first conductivity type, a second semiconductor layer of a second conductivity type that is so disposed as to come into contact with the first semiconductor layer and configured to multiply the carrier, a third semiconductor layer of the second conductivity type that is so disposed as to surround at least a part of the first semiconductor layer and the second semiconductor layer, a first contact electrode provided for cathode connection and connected to the first semiconductor layer, and a second contact electrode provided for anode connection and connected to the third semiconductor layer. At least either connection between the first contact electrode and the first semiconductor layer or connection between the second contact electrode and the third semiconductor layer may be made by Schottky junction. The carrier generation source may include a portion joined by the Schottky junction.

The present disclosure provides an electronic apparatus including an optical detection device that outputs a pixel signal corresponding to a carrier generated by photoelectric conversion, and a signal processing unit that performs predetermined signal processing for the pixel signal. The optical detection device includes a first pixel that has a photoelectric conversion element for generating a carrier by photoelectric conversion, a second pixel that has a carrier generation unit for generating a carrier by a cause other than photoelectric conversion, and a control circuit that controls a bias voltage applied to each of the photoelectric conversion element and the carrier generation unit, according to the carrier generated by the second pixel. The photoelectric conversion element includes a first photoelectric conversion region in which photoelectric conversion is possible and a first pinning film disposed at a position in contact with the first photoelectric conversion region. The carrier generation unit includes a second photoelectric conversion region in which photoelectric conversion is possible, and includes a second pinning film that is partially removed, at a position in contact with the second photoelectric conversion region, or no member that reduces dark current, in an entire area of the second photoelectric conversion region.

DESCRIPTION OF EMBODIMENTS

An optical detection device and an electronic apparatus according to embodiments will hereinafter be described with reference to the drawings. While main constituent parts of the optical detection device and the electronic apparatus will mainly be described in the following description, the optical detection device and the electronic apparatus can have constituent parts and functions not depicted nor explained. It is not intended that constituent parts and functions not depicted nor explained in the following description be excluded.

First Embodiment

Figure 1:
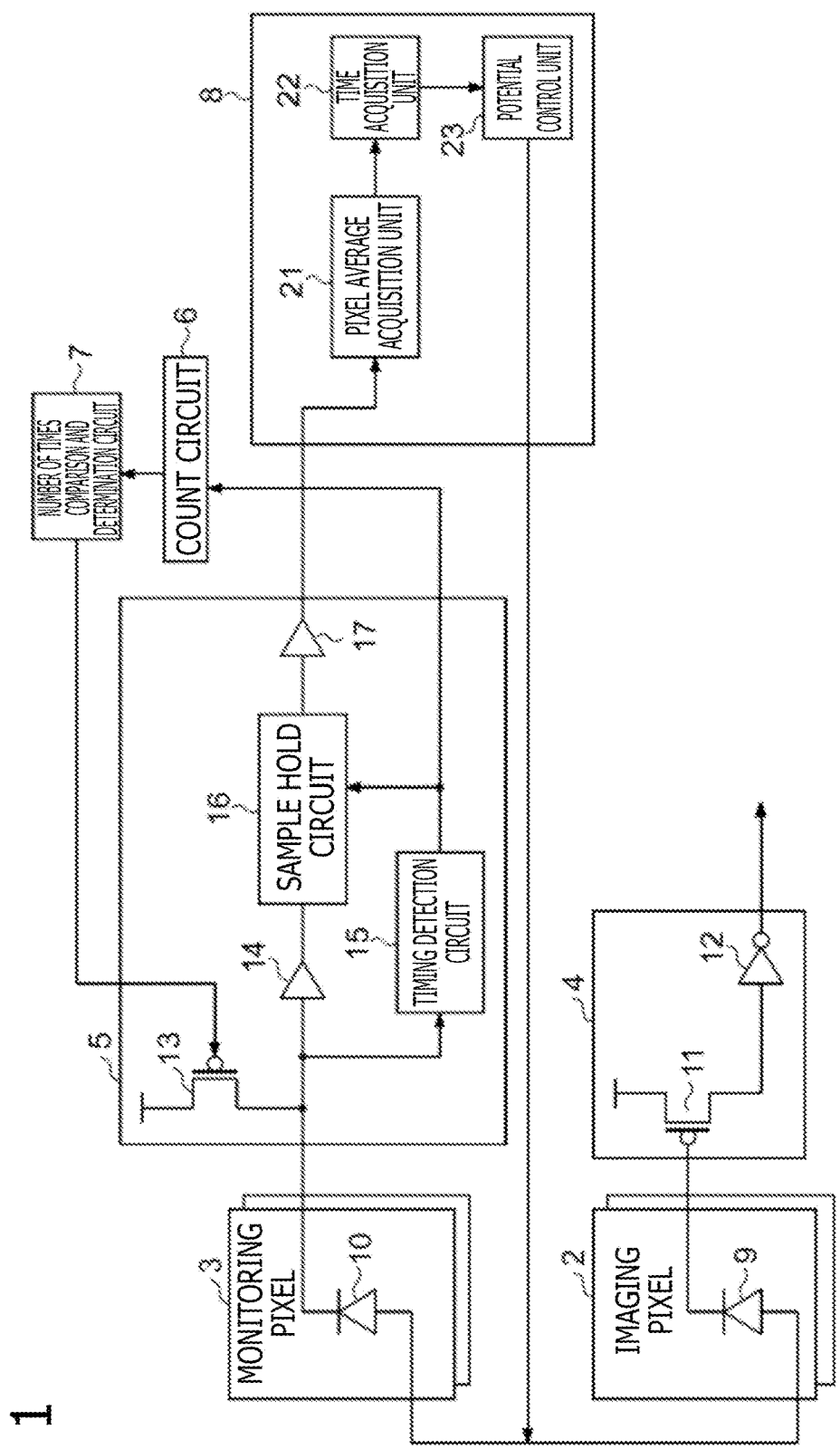
FIG. 1 is a block diagram depicting a schematic configuration of an optical detection device according to a first embodiment.

FIG. 1 is a block diagram depicting a schematic configuration of an optical detection device 1 according to a first embodiment. The optical detection device 1 in FIG. 1 includes an imaging pixel (first pixel) 2, a monitoring pixel (second pixel) 3, a first readout circuit 4, a second readout circuit 5, a count circuit 6, a number of times comparison and determination circuit 7, and a control circuit 8.

The imaging pixel 2 is a pixel for detecting incident light, and has a photoelectric conversion element 9 which generates a carrier by photoelectric conversion. The carrier here is an electron or a hole generated by photoelectric conversion. For example, a plurality of imaging pixels 2 are provided. The photoelectric conversion element 9 includes a first photoelectric conversion region in which photoelectric conversion is possible, and a first pinning film disposed at a position in contact with the first photoelectric conversion region. The photoelectric conversion element 9 is a SPAD (Single Photon Avalanche Diode) operable in a Geiger mode. The Geiger mode here is a mode for detecting a photon in a state where a reverse bias having a potential difference exceeding a breakdown voltage is applied between an anode and a cathode of the SPAD. The photoelectric conversion element 9 will hereinafter be referred to as a SPAD 9 in some cases. A cross-sectional structure of the photoelectric conversion element 9 will be described later.

The monitoring pixel 3 has a carrier generation unit 10 which achieves generation of a carrier by a cause other than photoelectric conversion. The monitoring pixel 3 is characterized in being capable of generating a carrier without the necessity of entrance of light. For example, a plurality of monitoring pixels 3 are provided. The carrier generation unit 10 has a second photoelectric conversion region in which photoelectric conversion is possible. A layer configuration and a material constituting the second photoelectric conversion region may be the same as those of the first photoelectric conversion region. As described above, the monitoring pixel 3 is characterized in generating a carrier by a cause other than photoelectric conversion. However, the monitoring pixel 3 has an element structure similar to an element structure of the imaging pixel 2, and can generate a carrier by photoelectric conversion when light enters the monitoring pixel 3. The carrier generation unit 10 has a SPAD operable in the Geiger mode. This SPAD is capable of generating a carrier and causing a breakdown without the necessity of entrance of light. The carrier generation unit 10 will hereinafter be referred to as a SPAD 10 in some cases.

It is assumed in the present description that the imaging pixel 2 has the photoelectric conversion element 9, and that the first readout circuit 4 connected to the imaging pixel 2 performs a process for generating a pixel signal corresponding to a carrier generated by the photoelectric conversion element 9. Similarly, it is assumed in the description that the monitoring pixel 3 has the carrier generation unit 10, and that the second readout circuit 5 connected to the monitoring pixel 3 performs a process for generating a pixel signal corresponding to a carrier generated by the carrier generation unit 10.

The carrier generation unit 10 may have a second pinning film disposed at a position in contact with the second photoelectric conversion region. The second pinning film is characterized in that at least a part of the second pinning film is partially removed. This partial removal of the second pinning film allows easy generation of dark current as will be described later. Accordingly, a carrier is allowed to be generated by a cause other than photoelectric conversion, and hence, a breakdown of the carrier generation unit 10 is achievable without the necessity of entrance of light.

Note that the second pinning film is not an indispensable constituent member for the carrier generation unit 10 as will be described later. For example, the carrier generation unit 10 need not have the second pinning film or other members for reducing dark current. The elimination of the member for reducing dark current allows easy generation of dark current on a surface or an inside of the second photoelectric conversion region, and thus allows easy generation of a carrier by a cause other than photoelectric conversion.

The first readout circuit 4 generates a pixel signal corresponding to a carrier generated by photoelectric conversion performed by the imaging pixel 2. The first readout circuit 4 has a PMOS transistor 11, which functions as a current source, and an inverter 12. A plurality of transistors may be provided instead of the PMOS transistor 11 and the inverter 12. For example, the plurality of transistors include a transfer transistor, a reset transistor, an amplification transistor, and a selection transistor.

The second readout circuit 5 generates a pixel signal corresponding to a carrier generated by the monitoring pixel 3. The second readout circuit 5 has a PMOS transistor 13, which functions as a current source, a buffer 14, a timing detection circuit 15, a sample hold circuit 16, and a buffer 17.

The buffer 14 disposed in a preceding stage of the sample hold circuit 16 is provided to equalize a capacitance of an input node of the sample hold circuit 16 with a capacitance of an output node of an inverter 12 included in the first readout circuit 4 connected to the imaging pixel 2. The buffer 14 thus provided can equalize a breakdown voltage of the photoelectric conversion element 9 included in the imaging pixel 2 with a breakdown voltage of the carrier generation unit 10 included in the monitoring pixel 3.

The timing detection circuit 15 monitors the cathode potential of the carrier generation unit 10. The cathode potential is the power source potential in a state where the carrier generation unit 10 does not generate a carrier. The timing detection circuit 15 detects timing of a lapse of a predetermined period from a time when the cathode potential starts lowering from the power source potential. The sample hold circuit 16 acquires the cathode potential corresponding to the timing detected by the timing detection circuit 15, and holds the acquired cathode potential. The sample hold circuit 16 outputs the holding potential to the buffer 17.

The count circuit 6 counts the number of times of detection of the foregoing timing by the timing detection circuit 15. This number of times indicates the number of times the carrier generation unit 10 has caused a breakdown.

The number of times comparison and determination circuit 7 determines whether or not the number of times counted by the count circuit 6 has reached a predetermined reference number of times. When determining that the counted number of times has reached the predetermined number of times, the number of times comparison and determination circuit 7 changes an operation condition for the monitoring pixel 3.

A first example of the change of the operation condition for the monitoring pixel 3 is to prohibit generation of a carrier by the monitoring pixel 3. In this case, the carrier generation unit 10 does not cause a breakdown, and thus achieves reduction of power consumption by the monitoring pixel 3. Further, a second example of the change of the operation condition for the monitoring pixel 3 is to operate the monitoring pixel 3 in a non-Geiger mode by applying a reverse bias having a potential difference smaller than that of a Geiger mode between the anode and the cathode of the carrier generation unit 10 included in the monitoring pixel 3. In this case, the carrier generation unit 10 operated in the non-Geiger mode does not cause a breakdown even when generating a carrier. Accordingly, more reduction of power consumption is achievable than in the Geiger mode operation.

The control circuit 8 has a pixel average acquisition unit 21, a time acquisition unit 22, and a potential control unit 23. The pixel average acquisition unit 21 acquires an average for the holding potential of a plurality of monitoring images as a pixel average value. The time average acquisition unit obtains a time average value of the pixel average values. The potential control unit 23 compares the time average value of the cathode potential with a target voltage set beforehand, and lowers the anode potential as the time average value of the cathode potential increases. All anodes of the plurality of monitoring pixels 3 and the plurality of imaging pixels 2 are connected to a common output node of the potential control unit 23. Accordingly, the potential control unit 23 can control each anode potential.

Note that the monitoring pixel 3 may monitor anode potential instead of cathode potential. In this case, the potential control unit 23 controls each cathode potential.

(Cathode Potential and Excess Bias of SPAD)

Figure 2:
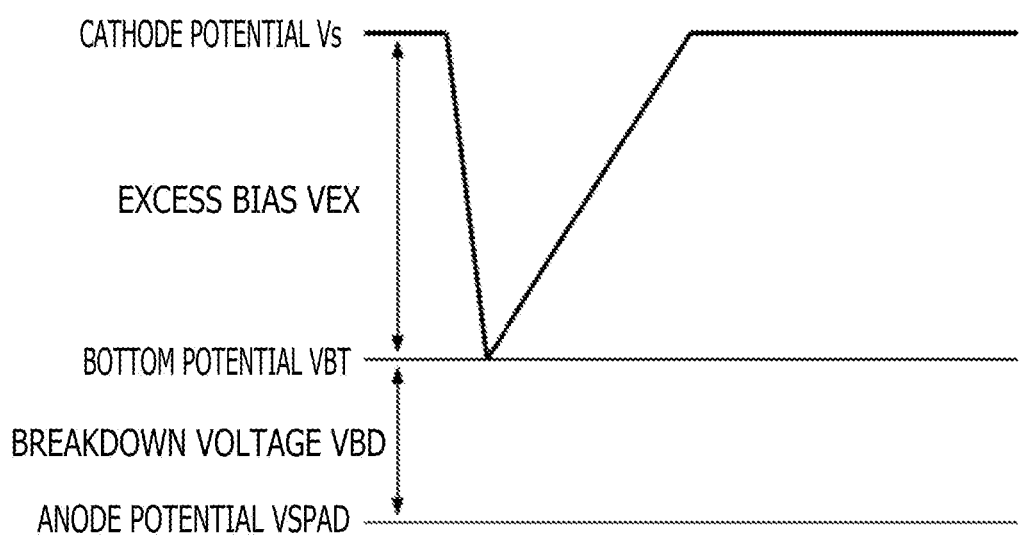
FIG. 2 is a diagram illustrating a state of variations of cathode potential with time.

FIG. 2 is a diagram illustrating a state of variations of cathode potential Vs with time. Specifically, FIG. 2 illustrates a magnitude relation between the cathode potential Vs, anode potential VSPAD, and bottom potential (quench voltage) VBT.

As depicted in FIG. 1, a power source voltage is supplied to the cathode of the carrier generation unit 10 from the PMOS transistor 13. Accordingly, the cathode potential is the power source potential in a steady state. When the carrier generation unit 10 generates a carrier by a cause other than photoelectric conversion, the cathode potential Vs lowers to the bottom potential VBT. Thereafter, the cathode potential Vs of the carrier generation unit 10 returns to the original power source potential by being recharged with use of the PMOS transistor 13.

A potential difference between the power source potential and the bottom potential VBT is here referred to as excess bias VEX. In addition, a potential difference between the bottom potential VBT and the anode potential VSPAD is referred to as a breakdown voltage VBD. Assuming that the power source potential and the anode potential VSPAD are not variable, the excess bias VEX is variable according to variations of the breakdown voltage VBD or temperature.

When the breakdown voltage VBD increases, the bottom potential VBT reached as a result of a breakdown by the carrier generation unit 10 increases. In other words, the excess bias VEX lowers. When the excess bias VEX lowers, sensitivity of the carrier generation unit 10 lowers. In this case, carrier detection efficiency lowers. For improving carrier detection efficiency, the anode potential VSPAD is lowered by the control circuit 8 in a case where the potential held by the sample hold circuit 16 is higher than a target value of the predetermined bottom potential VBT. On the other hand, in a case where the potential held by the sample hold circuit 16 is lower than the target value of the bottom potential VBT, there is a possibility that elements will be destroyed as a result of an excess of allowable maximum potential of the second readout circuit 5. Accordingly, the anode potential VSPAD is set to a high value. This voltage control can achieve intended carrier detection efficiency.

(Cross-Sectional Structure of SPAD)

Figure 3A:
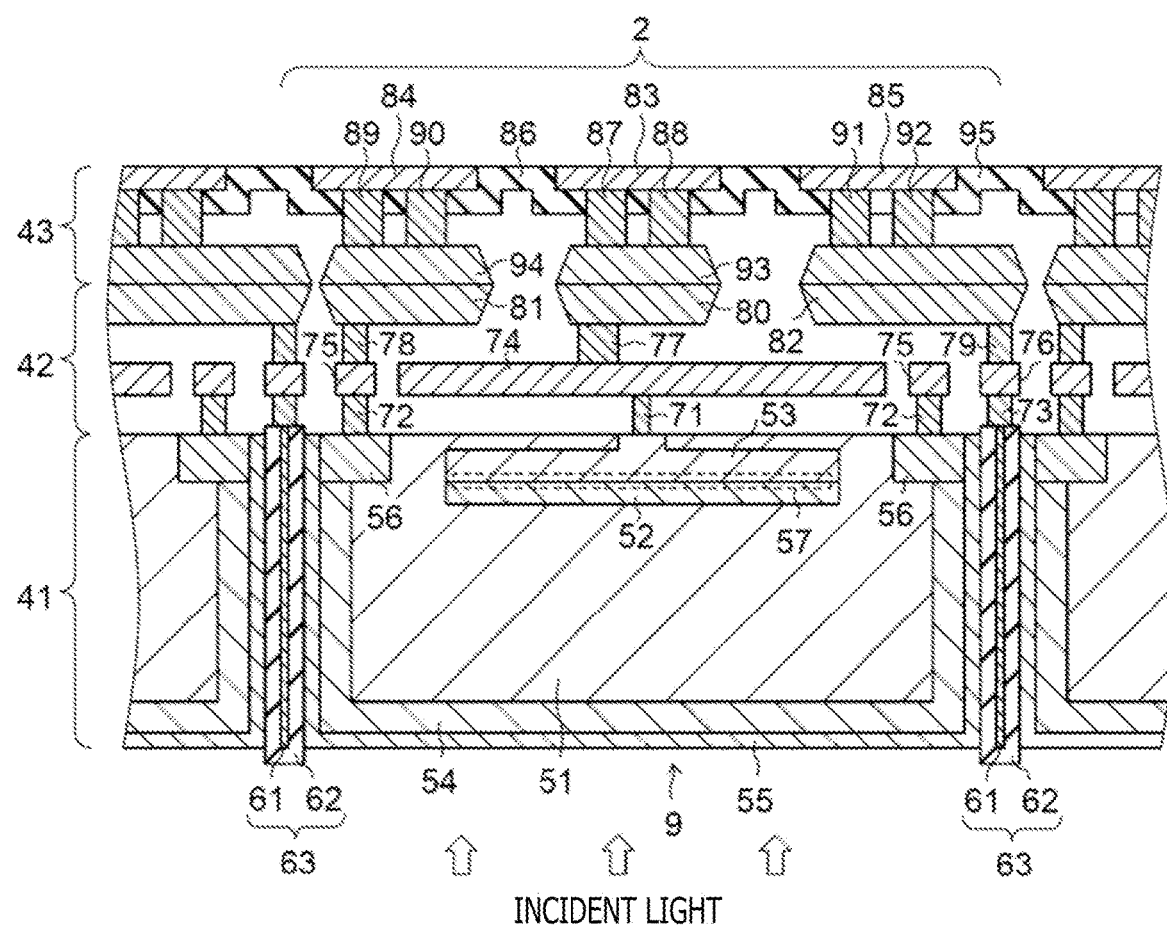
FIG. 3A is a cross-sectional diagram of an imaging pixel.
Figure 3B:
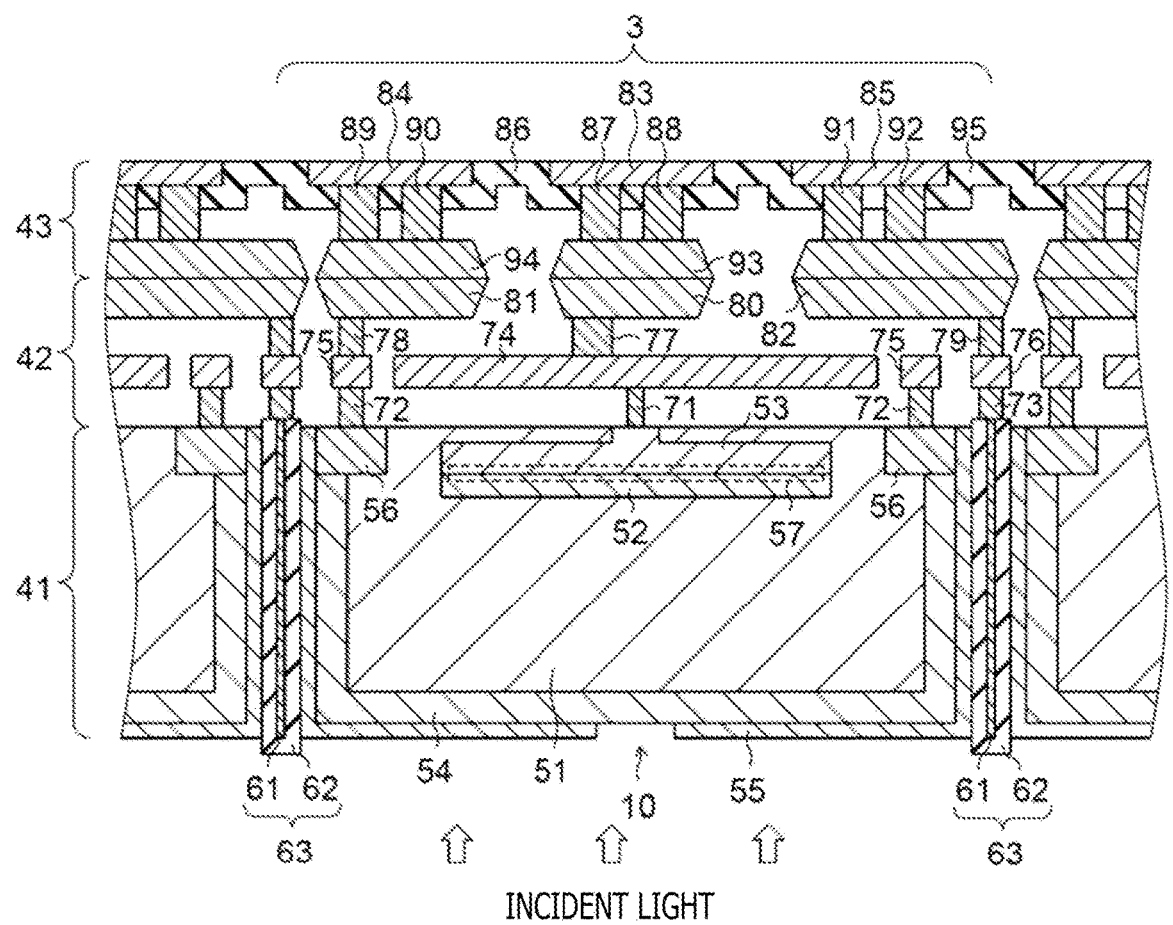
FIG. 3B is a cross-sectional diagram of a monitoring pixel.

FIG. 3A is a cross-sectional diagram of the imaging pixel 2, while FIG. 3B is a cross-sectional diagram of the monitoring pixel 3. The imaging pixel 2 depicted in FIG. 3A has a laminated structure where a sensor substrate 41, a sensor side wiring layer 42, and a logic side wiring layer 43 are laminated. A not-depicted logic circuit substrate is laminated in the logic side wiring layer 43. The first readout circuit 4, the second readout circuit 5, the count circuit 6, the number of times comparison and determination circuit 7, and the control circuit 8 each depicted in FIG. 1 are disposed on the logic circuit substrate. Note that at least some of the first readout circuit 4, the second readout circuit 5, the count circuit 6, the number of times comparison and determination circuit 7, and the control circuit 8 may be disposed on the sensor substrate 41 side.

For example, the sensor substrate 41 is a semiconductor substrate including sliced thin monocrystal silicon. A plurality of photoelectric conversion elements 9 are disposed along a substrate surface of the sensor substrate 41. FIG. 3A depicts a cross-sectional structure of one imaging pixel 2 including one photoelectric conversion element 9. The photoelectric conversion element 9 has an N-well 51, a P-type diffusion layer 52, an N-type diffusion layer 53, a hole accumulation layer 54, a pinning film (first pinning film) 55, and a high concentration P-type diffusion layer 56, each disposed on the sensor substrate 41. A depletion layer formed in a region connecting the P-type diffusion layer 52 and the N-type diffusion layer 53 constitutes an avalanche multiplication region 57. A lower end side of FIG. 3A corresponds to a light entrance surface side, and will be referred to as a rear surface in the present description.

The N-well 51 is a region where N-type impurity ions are implanted and diffused in the sensor substrate 41. The N-well 51 forms an electric field for transferring an electron generated by the photoelectric conversion element 9 to the avalanche multiplication region 57. As will be described later, a P-well where P-type impurity ions are implanted and diffused may be provided instead of the N-well 51.

The P-type diffusion layer 52 is a high concentration P-type (P+) diffusion layer disposed in the vicinity of a front surface of the sensor substrate 41 and formed on the rear surface side with respect to the N-type diffusion layer 53. The N-type diffusion layer 53 is a high concentration N-type (N+) diffusion layer disposed in the vicinity of the front surface of the sensor substrate 41 and formed on the front surface side with respect to the P-type diffusion layer 52. The N-type diffusion layer 53 is connected to a contact electrode 71 for cathode connection.

The hole accumulation layer 54 is a P-type diffusion layer so formed as to surround a side surface and a bottom surface of the N-well 51, and accumulates holes. In addition, the hole accumulation layer 54 is connected to a contact electrode 72 included in the photoelectric conversion element 9 and provided for anode connection, and is configured to achieve bias voltage adjustment. Accordingly, the hole accumulation layer 54 can enhance the hole concentration and strengthen pinning including the pinning film 55 to reduce generation of dark current.

The pinning film 55 is a high concentration P type (P+) diffusion layer formed on a surface outside the hole accumulation layer 54 (more specifically, on a rear surface of the sensor substrate 41 and a side surface in contact with an insulation film 62), and reduces generation of dark current similarly to the hole accumulation layer 54.

The high concentration P-type diffusion layer 56 is a high concentration P-type (P++) diffusion layer formed in the vicinity of the front surface of the sensor substrate 41 and surrounding an outer circumference of the N-well 51, and is provided to connect the hole accumulation layer 54 to the contact electrode 72 included in the photoelectric conversion element 9 and provided for anode connection.

The avalanche multiplication region 57 is a high electric field region formed in a boundary surface between the P-type diffusion layer 52 and the N-type diffusion layer 53 by a voltage applied to the N-type diffusion layer 53 via the contact electrode 71 for cathode connection, and multiplies electrons generated by one photon entering the photoelectric conversion element 9.

A pixel separation portion 63 having a double structure formed by a metal film 61 and the insulation film 62 is provided between the adjacent photoelectric conversion elements 9. The adjacent photoelectric conversion elements 9 are insulated and separated from each other by the pixel separation portion 63 provided as described above. For example, the pixel separation portion 63 is so formed as to penetrate the sensor substrate 41 from the rear surface to the front surface of the sensor substrate 41.

The metal film 61 is a film including metal reflecting or absorbing light (e.g., tungsten). The insulation film 62 is a film having insulation properties, such as a film including $SiO_2$. For example, the pixel separation portion 63 is formed by embedding the metal film 61 in the sensor substrate 41 such that a surface of the metal film 61 is covered with the insulation film 62. The adjacent photoelectric conversion elements 9 are electrically and optically separated from each other by the pixel separation portion 63.

The sensor side wiring layer 42 includes the contact electrodes 71 and 72, a contact electrode 73, metal wires 74 to 76, contact electrodes 77 to 79, and metal pads 80 to 82.

The contact electrode 71 connects the N-type diffusion layer 53 and the metal wire 74. The contact electrode 72 connects the high concentration P-type diffusion layer 56 and the metal wire 75. The contact electrode 73 connects the metal film 61 and the metal wire 76.

The metal wire 74 is formed wider than the avalanche multiplication region 57 so as to cover at least the avalanche multiplication region 57. The metal wire 74 reflects light having passed through the photoelectric conversion element 9, in a direction toward the photoelectric conversion element 9.

The metal wire 75 is so formed as to cover an outer circumference of the metal wire 74, and to overlap with the high concentration P-type diffusion layer 56. The metal wire 76 is so formed as to connect to the metal film 61 at four corners of the photoelectric conversion element 9.

The contact electrode 77 connects the metal wire 74 and the metal pad 80. The contact electrode 78 connects the metal wire 75 and the metal pad 81. The contact electrode 79 connects the metal wire 76 and the metal pad 82.

The metal pads 80 to 82 are connected to the metal pads 93 to 95 formed in the logic side wiring layer 43, by Cu—Cu junction, respectively.

The logic side wiring layer 43 includes electrode pads 83 to 85, an insulation layer 86, contact electrodes 87 to 92, and metal pads 93 to 95.

The electrode pads 83 to 85 are provided for connection with the logic circuit substrate. The insulation layer 86 insulates the electrode pads 83 to 85 from each other.

The contact electrodes 87 and 88 connect the electrode pad 83 and the metal pad 93. The contact electrodes 89 and 90 connect the electrode pad 84 and the metal pad 94. The contact electrodes 91 and 92 connect the electrode pad 85 and the metal pad 95.

The metal pad 93 is joined to the metal pad 80. The metal pad 94 is joined to the metal pad 81. The metal pad 95 is joined to the metal pad 82.

Such a wiring structure electrically connects the electrode pad 83 included in the photoelectric conversion element 9 and provided for cathode connection to the N-type diffusion layer 53 via the contact electrodes 87 and 88, the metal pad 93, the metal pad 80, the contact electrode 77, the metal wire 74, and the contact electrode 71, for example. The wiring structure also electrically connects the electrode pad 84 included in the photoelectric conversion element 9 and provided for anode connection to the high concentration P-type diffusion layer 56 via the contact electrodes 89 and 90, the metal pad 94, the metal pad 81, the contact electrode 78, the metal wire 75, and the contact electrode 72. The cathode potential of the photoelectric conversion element 9 is adjustable by application of a bias voltage to the electrode pad 83, for example.

Moreover, the electrode pad 85 is configured to be connected to the metal film 61 via the contact electrodes 91 and 92, the metal pad 95, the metal pad 82, the contact electrode 79, the metal wire 76, and the contact electrode 73. Accordingly, the photoelectric conversion element 9 is capable of applying a bias voltage, which is supplied from the logic circuit substrate to the electrode pad 85, to the metal film 61. In this manner, potential in a boundary area between adjacent pixels can be set to a desired potential level.

A cross-sectional structure of the monitoring pixel 3 depicted in FIG. 3B is similar to the cross-sectional structure of FIG. 3A, and corresponding members are given the same reference signs. For example, the pinning film (second pinning film) 55 is partially removed from the monitoring pixel 3 depicted in FIG. 3B. FIG. 3B depicts an example in which the pinning film 55 disposed on the surface (light entrance surface) on the side opposite to the sensor side wiring layer 42 is partially removed. As will be described later, the portion from which the pinning film 55 is partially removed may be a portion other than the portion along the light entrance surface. Moreover, the portion from which the pinning film 55 is partially removed may have any size and shape. Furthermore, the pinning film 55 may be partially removed from a plurality of positions.

Dark current is easily generated at the portion from which the pinning film is partially removed. In this manner, the carrier generation unit 10 is allowed to generate electrons according to dark current.

The monitoring pixel 3 according to the present embodiment is capable of causing a breakdown of the carrier generation unit 10 regardless of whether or not light has entered and independently of an incident light quantity.

Note that the bottom potential described above may be more variable by entrance of light into the carrier generation unit 10 than in a case of no entrance of light into the carrier generation unit 10. These variations of the bottom potential may produce errors in adjustment of an anode voltage. Accordingly, the monitoring pixel 3 may have a structure preventing entrance of light.

(Light Shielding Structure of Carrier Generation Unit 10)

Figure 4:
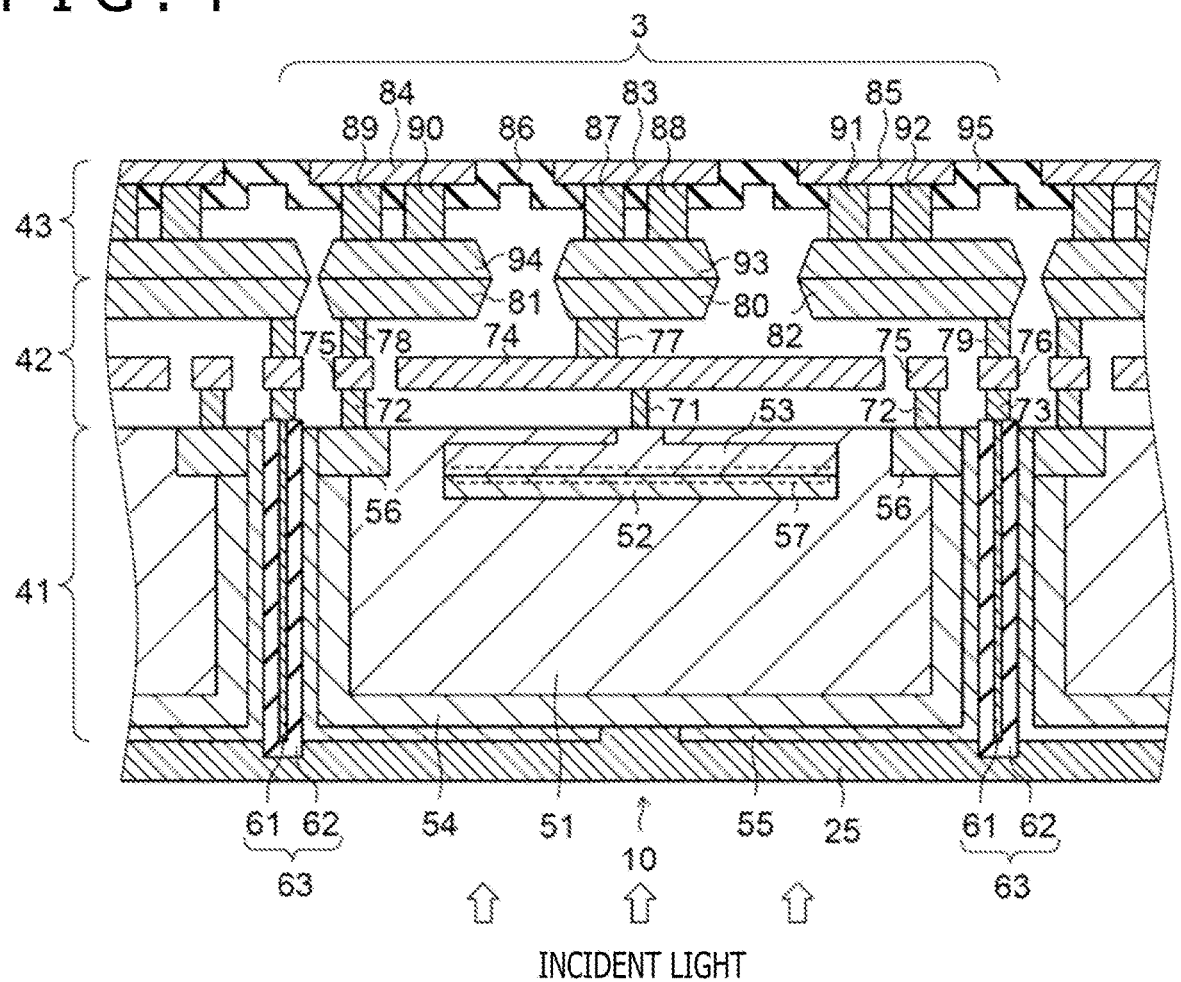
FIG. 4 is a cross-sectional diagram of the monitoring pixel according to one modification of FIG. 3B.

FIG. 4 is a cross-sectional diagram of the monitoring pixel 3 according to one modification of FIG. 3B. The monitoring pixel 3 in FIG. 4 has a light shielding member 25 disposed on the pinning film 55 on the light entrance surface side. The light shielding member 25 in FIG. 4 is also called OPB (Optical Black). The light shielding member 25 in FIG. 4 may include the same material as that of the pixel separation portion 63. While a part of the pinning film 55 on the light entrance surface side is removed in FIG. 4, the portion from which the pinning film 55 is partially removed may be a portion different from the light entrance surface (e.g., a boundary region of the pixel) as described above. Alternatively, the entire pinning film 55 may be removed.

In the state where the light entrance surface side of the monitoring pixel 3 is covered with the light shielding member 25, light does not enter the carrier generation unit 10 included in the monitoring pixel 3. Accordingly, the carrier generation unit 10 is allowed to generate a carrier by only a cause other than photoelectric conversion. This configuration can reduce variations of bottom potential and excess bias in a case of a breakdown of the carrier generation unit 10 included in the monitoring pixel 3, and thus can accurately adjust a bias voltage of each of the photoelectric conversion element 9 and the carrier generation unit 10.

(Application to ToF Sensor)

Figure 5:
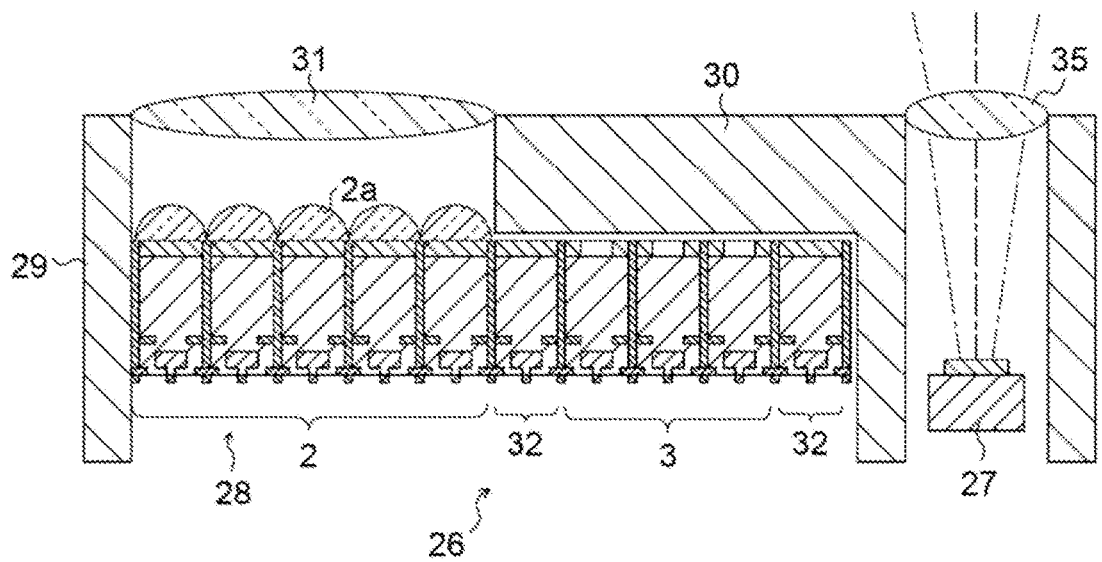
FIG. 5 is a schematic cross-sectional diagram of a ToF sensor.

The optical detection device 1 according to the present embodiment is applicable to a ToF sensor for distance measurement. FIG. 5 is a schematic cross-sectional diagram of a ToF sensor 26. The ToF sensor 26 in FIG. 5 includes a light emission unit 27, which applies light to an object as a target of distance measurement, and a light reception unit 28, which receives reflection light from the object. The optical detection device 1 according to the present embodiment is incorporated in the light reception unit 28 in FIG. 5. The light reception unit 28 and the light emission unit 27 are supported by a support member 29. A light shielding wall 30 is disposed between the light emission unit 27 and the light reception unit 28 such that light emitted from the light emission unit 27 is not received by the light reception unit 28. The light shielding wall 30 is formed integrally with the support member 29.

The light reception unit 28 in FIG. 5 has the imaging pixels 2 and the monitoring pixels 3. On-chip lenses 2a are disposed on the light entrance surface side of the imaging pixels 2, while a converging lens 31 is disposed before the imaging pixels 2 in an optical axis direction. Light entering the converging lens 31 is converged and introduced into the imaging pixels 2. Further, the light shielding wall 30 is disposed on the light entrance surface side of the monitoring pixels 3 and faces the monitoring pixels 3 to prevent entrance of light converged by the converging lens 31 and light emitted from the light emission unit 27 into the monitoring pixels 3.

The imaging pixels 2 and the monitoring pixels 3 are formed on an identical substrate by a common semiconductor process. In this case, there is a possibility that the imaging pixels 2 and the monitoring pixels 3 are located close to each other. Accordingly, as depicted in FIG. 5, dummy pixels 32 may be disposed around the monitoring pixels 3, i.e., at a position between the imaging pixels 2 and the monitoring pixels 3. Each of the dummy pixels 32 is a pixel used neither as the imaging pixel 2 nor as the monitoring pixel. The dummy pixel 32 may be used for other purposes. The dummy pixels 32 disposed around the monitoring pixels 3 as described above can further lower the possibility of entrance of light into the monitoring pixels 3.

Figure 6:
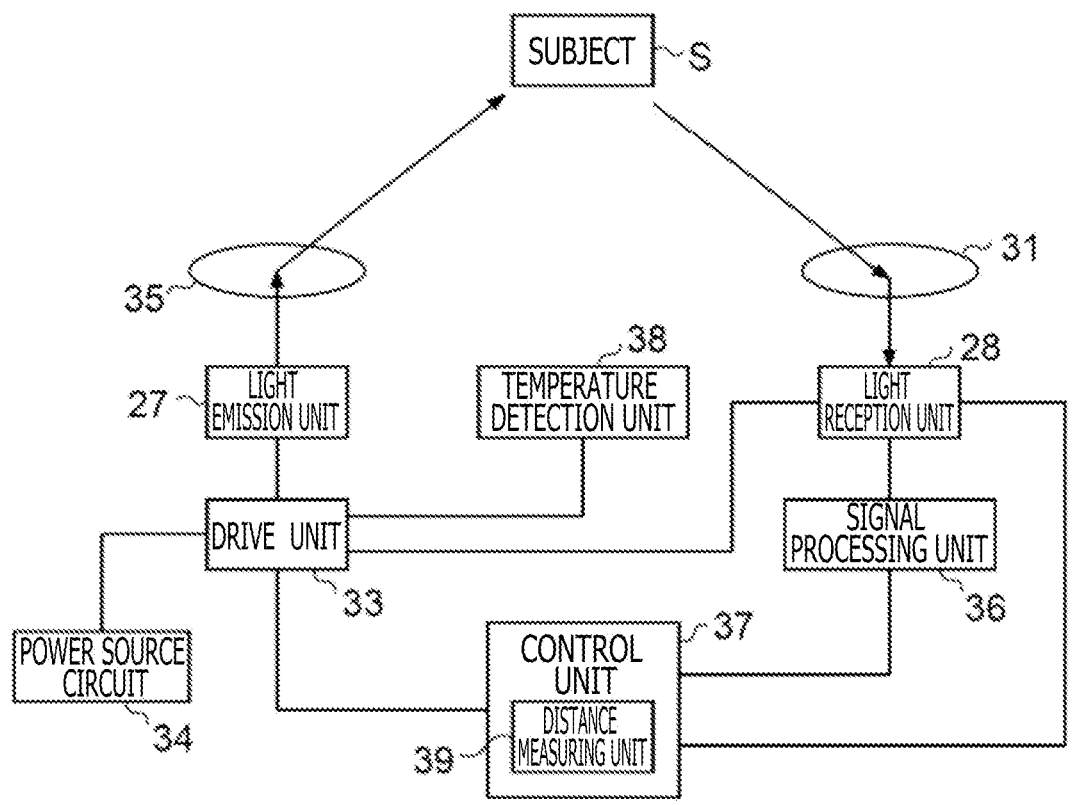
FIG. 6 is a block diagram depicting a schematic configuration of a distance measuring device including the ToF sensor in FIG. 5.

FIG. 6 is a block diagram depicting a schematic configuration of a distance measuring device 40 including the ToF sensor 26 in FIG. 5. The distance measuring device 40 includes the light emission unit 27, the light reception unit 28, the reception side optical system (converging lens) 31, a drive unit 33, a power source circuit 34, an emission side optical system 35, a signal processing unit 36, a control unit 37, and a temperature detection unit 38.

The light emission unit 27 emits light by using a plurality of light sources. For example, the light emission unit 27 has a plurality of light emission elements each including a VCSEL (Vertical Cavity Surface Emitting LASER) as respective light sources, and includes arrays of these light emission elements in a predetermined form such as a matrix shape. The light emission unit 27 corresponds to the optical detection device 1 in FIG. 1, and each of the light emission elements corresponds to the photoelectric conversion element 9.

The drive unit 33 has a power source circuit 34 for driving the light emission unit 27. For example, the power source circuit 34 generates a power source voltage for the drive unit 33 according to an input voltage from a not-depicted battery or the like provided on the distance measuring device 40. The drive unit 33 drives the light emission unit 27 according to this power source voltage.

Light emitted from the light emission unit 27 is applied to a subject S corresponding to a distance measurement target via the emission side optical system 35. The light applied and reflected by the subject S enters a light receiving surface of the light reception unit 28 via the reception side optical system 31.

As described above, the light reception unit 28 has a plurality of imaging pixels 2. Each of the imaging pixels 2 into which reflection light enters receives reflection light from the subject S via the reception side optical system 31, converts the reflection light into an electric signal, and outputs the electric signal.

For outputting the electric signal obtained by photoelectric conversion of the received light, the light reception unit 28 converts a voltage change produced by a breakdown, for example, into a digital signal, and outputs the digital signal to the signal processing unit 36 disposed in a subsequent stage.

Moreover, the light reception unit 28 according to the present embodiment outputs a frame synchronized signal to the drive unit 33. In this manner, the drive unit 33 is allowed to cause the light emission elements of the light emission unit 27 to emit light at a timing corresponding to a frame cycle of the light reception unit 28.

For example, the signal processing unit 36 constitutes a signal processing processor including a DSP (Digital Signal Processor) or the like. The signal processing unit 36 performs various types of signal processing for a digital signal input from the light reception unit 28.

For example, the control unit 37 includes a microcomputer which has a CPU (Central Processing Unit), a ROM (Read Only Memory), a RAM (Random Access Memory), and others, or an information processing device such as a DSP, and is configured to control the drive unit 33 for controlling a light emission operation of the light emission unit 27 and control a light reception operation of the light reception unit 28.

The control unit 37 has a function as a distance measuring unit 39. The distance measuring unit 39 measures a distance to the subject S in reference to a signal input via the signal processing unit 36 (i.e., a signal obtained by receiving reflection light from the subject S). The distance measuring unit 39 according to the present embodiment measures distances from respective portions of the subject S to specify a three-dimensional shape of the subject S.

The temperature detection unit 38 detects the temperature of the light emission unit 27. For example, the temperature detection unit 38 may be configured to achieve temperature detection with use of a diode.

Information associated with the temperature detected by the temperature detection unit 38 is supplied to the drive unit 33. The drive unit 33 having received the information associated with the temperature is thus capable of driving the light emission unit 27 in reference to this temperature information.

In a case where what is generally called a direct ToF (dTOF) system is adopted as the ToF system, the light emission unit 27 performs pulse driving. In this case, the distance measuring unit 39 calculates a time difference between light emission and light reception according to light emitted from the light emission unit 27 and received by the light reception unit 28, in reference to a signal input via the signal processing unit 36, and calculates a distance from each of the portions of the subject S in reference to the calculated time difference and light speed.

In addition, in a case where what is generally called an indirect ToF (iTOF) system (phase difference method) is adopted as the ToF system, each of the distances is detected by a phase difference between signals of light received by the light reception unit 28.

(Layout of Optical Detection Device 1)

Figure 7A:
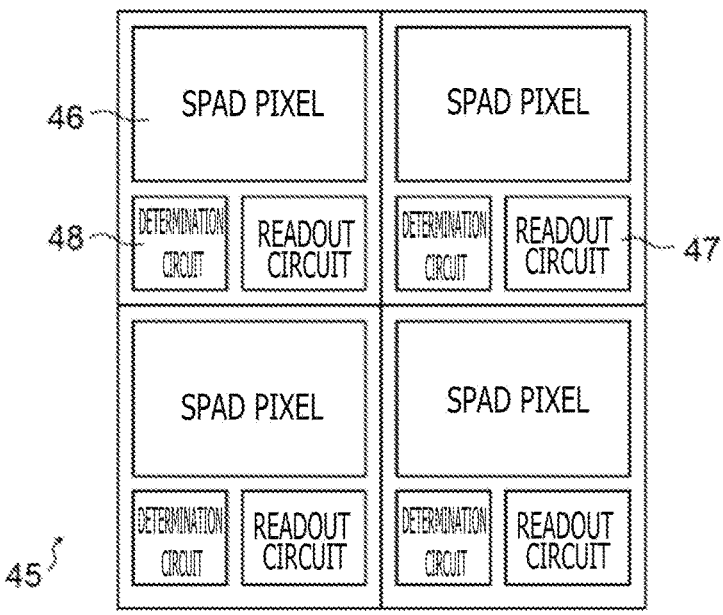
FIG. 7A is a plan diagram depicting a part of a pixel array unit.

The optical detection device 1 according to the present embodiment includes a pixel array unit 45 which has a plurality of imaging pixels 2 and a plurality of monitoring pixels 3. FIG. 7A is a plan diagram depicting a part of the pixel array unit 45. In FIG. 7A, each of the monitoring pixels 3 is referred to as a SPAD pixel 46. Moreover, in FIG. 7A, the second readout circuit 5 for the corresponding one SPAD pixel 46 is referred to as a readout circuit 47. Furthermore, the count circuit 6, the number of times comparison and determination circuit 7, and the control circuit 8 each for the corresponding one SPAD pixel 46 are collectively referred to as a determination circuit 48.

In FIG. 7A, the SPAD pixel 46, the readout circuit 47, and the determination circuit 48 constitute one pixel, and are arranged adjacently to each other. While FIG. 7A depicts a layout of four pixels, the number of pixels included in the pixel array unit 45 may be any number.

Figure 7B:
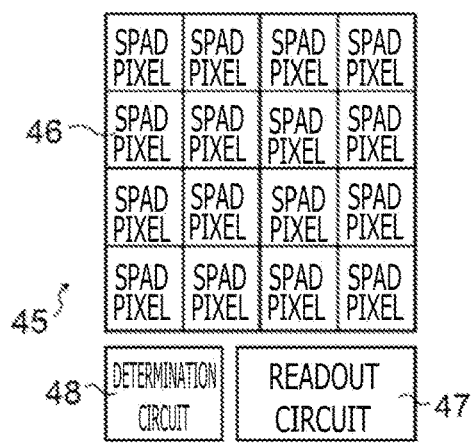
FIG. 7B is a diagram depicting an example of the pixel array unit where one readout circuit and one determination circuit are associated with a plurality of SPAD pixels.

FIG. 7B depicts an example of the pixel array unit 45 where one readout circuit 47 and one determination circuit 48 are associated with a plurality of SPAD pixels 46. In the case of FIG. 7B, the plurality of SPAD pixels 46 share one readout circuit 47 and one determination circuit 48. In this case, a probability of a breakdown of at least one pixel increases. Accordingly, highly frequent acquisition of the bottom potential VBT is easily achievable. As a result, execution of potential control can be completed in a short period of time.

Figure 7C:
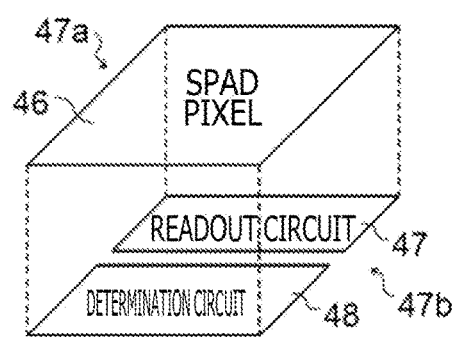
FIG. 7C is a diagram depicting an example of a first substrate and a second substrate laminated on each other.

FIG. 7C depicts an example of a lamination of a first substrate 49a, which includes the pixel array unit 45 having the SPAD pixel 46, and a second substrate 49b, which includes the readout circuit 47 and the determination circuit 48. The first substrate 49a and the second substrate 49b are connected to each other by Cu—Cu junction, for example, and transfer signals between each other. In the case of FIG. 7C, the one SPAD pixel 46 on the first substrate 49a and the one readout circuit 47 and the one determination circuit 48 on the second substrate 49b are associated with each other.

Figure 7D:
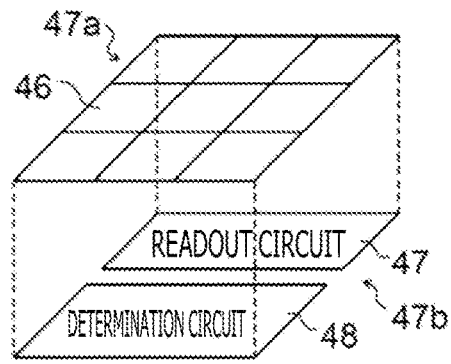
FIG. 7D is a diagram depicting one modification of FIG. 7C.

FIG. 7D is one modification of FIG. 7C. In this modification, a plurality of SPAD pixels 46 on the first substrate 49a and one readout circuit 47 and one determination circuit 48 on the second substrate 49b are associated with each other. The case of FIG. 7D achieves reduction of the degree of integration of the second substrate 49b. Accordingly, other circuits are allowed to be disposed on the second substrate 49b.

While presented with reference to FIGS. 7C and 7D are the examples where the SPAD pixel 46, the readout circuit 47, and the determination circuit 48 are arranged separately on the first substrate 49a and the second substrate 49b, three or more substrates may be laminated to separately arrange the readout circuit 47 and the determination circuit 48 on two or more substrates.

Specific arrangement positions of the plurality of imaging pixels 2 and the plurality of monitoring pixels 3 arranged in the pixel array unit 45 may be any positions selected from various possible arrangement positions.

(Layout of Imaging Pixel 2 and Monitoring Pixel 3)

Figure 8A:
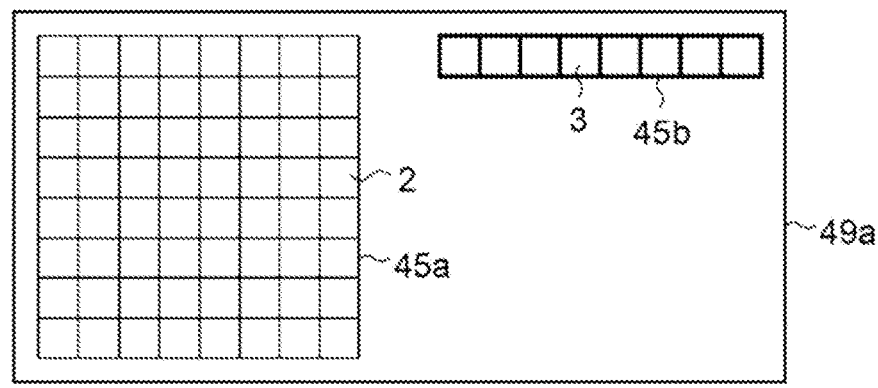
FIG. 8A is a schematic plan diagram depicting a first example of arrangement positions of the imaging pixels and the monitoring pixels.

FIG. 8A is a schematic plan diagram depicting a first example of arrangement positions of the imaging pixels 2 and the monitoring pixels 3 included in the pixel array unit 45. FIG. 8A depicts an example which includes a first pixel array unit 45a for the imaging pixels 2 and a second pixel array unit 45b for the monitoring pixels 3. The first pixel array unit 45a and the second pixel array unit 45b are arranged at positions away from each other on an identical substrate constituting a substrate 49a. Moreover, while the plurality of imaging pixels 2 included in the first pixel array unit 45a are two-dimensionally arranged, the plurality of monitoring pixels 3 included in the second pixel array unit 45b are arranged in one direction in a line shape.

Figure 8B:
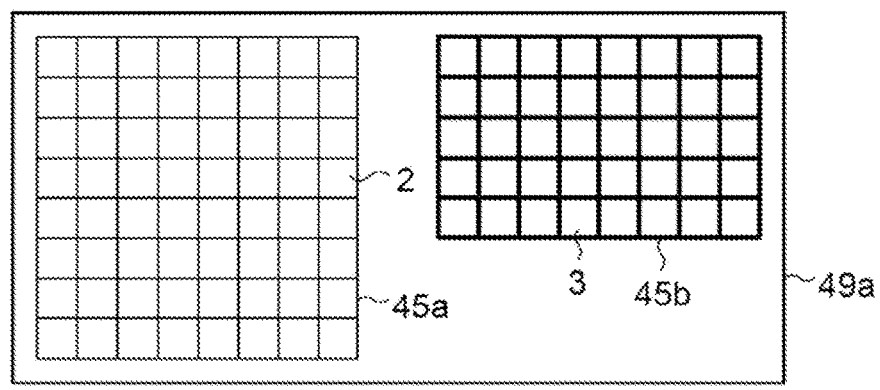
FIG. 8B is a schematic plan diagram depicting a second example of the arrangement positions of the imaging pixels and the monitoring pixels.

FIG. 8B is a schematic plan diagram depicting a second example of arrangement positions of the imaging pixels 2 and the monitoring pixels 3 included in the pixel array unit 45. FIG. 8B is different from FIG. 8A in that the plurality of monitoring pixels 3 included in the second pixel array unit 45b are two-dimensionally arranged.

Figure 8C:
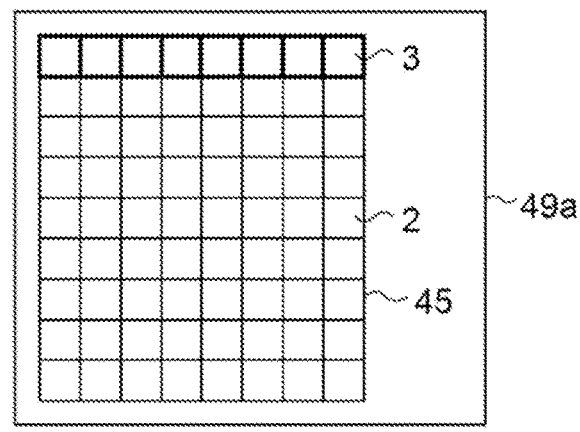
FIG. 8C is a schematic plan diagram depicting a third example of the arrangement positions of the imaging pixels and the monitoring pixels.

FIG. 8C is a schematic plan diagram depicting a third example of arrangement positions of the imaging pixels 2 and the monitoring pixels 3 included in the pixel array unit 45. FIG. 8C depicts an example where a plurality of imaging pixels 2 and a plurality of monitoring pixels 3 are arranged close to each other in the same pixel array unit 45. While the plurality of monitoring pixels 3 are arranged in the vicinity of an upper end of the pixel array unit 45 in FIG. 8C, the plurality of monitoring pixels 3 included in the pixel array unit 45 may be arranged at any positions.

Figure 8D:
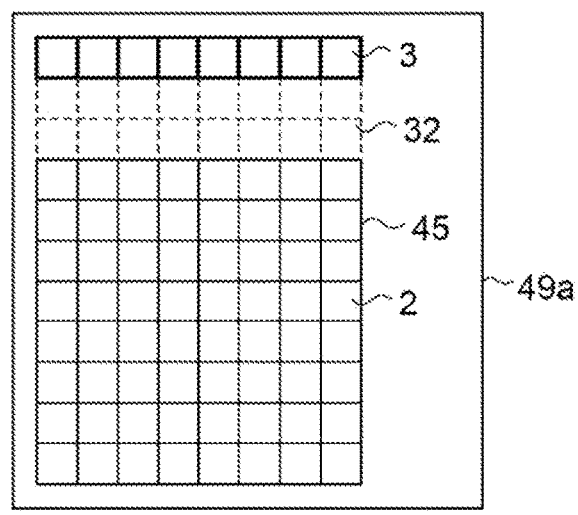
FIG. 8D is a schematic plan diagram depicting a fourth example of the arrangement positions of the imaging pixels and the monitoring pixels.

FIG. 8D is a schematic plan diagram depicting a fourth example of arrangement positions of the imaging pixels 2 and the monitoring pixels 3 included in the pixel array unit 45. FIG. 8D depicts an example where a plurality of imaging pixels 2 and a plurality of monitoring pixels 3 are arranged away from each other within the same pixel array unit 45. For example, the dummy pixels 32 are arranged between the plurality of imaging pixels 2 and the plurality of monitoring pixels 3 in the pixel array unit 45. Each of the dummy pixels 32 is a pixel used neither as the imaging pixel 2 nor as the monitoring pixel 3.

Figure 8E:
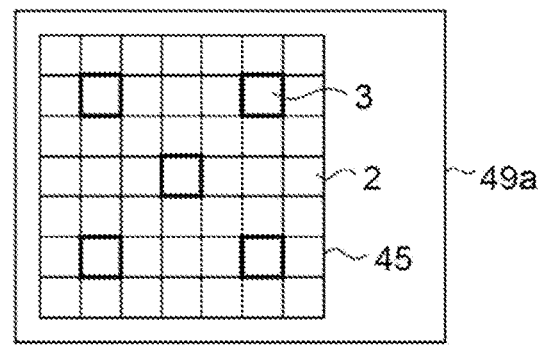
FIG. 8E is a schematic plan diagram depicting a fifth example of the arrangement positions of the imaging pixels and the monitoring pixels.

FIG. 8E is a schematic plan diagram depicting a fifth example of arrangement positions of the imaging pixels 2 and the monitoring pixels 3 included in the pixel array unit 45. In FIG. 8E, the monitoring pixels 3 are arranged between arrangement positions of a plurality of imaging pixels 2 within the pixel array unit 45 where the plurality of imaging pixels 2 are arranged. Accordingly, the monitoring pixels 3 are dispersedly arranged within the pixel array unit 45.

As depicted in FIG. 5, it is preferable to adopt such a configuration which allows entrance of light into the imaging pixels 2 but prohibits entrance of light into the monitoring pixels 3. Accordingly, the light shielding member 25 may be disposed between the imaging pixels 2 and the monitoring pixels 3. A plurality of modes are adoptable for a light shielding structure of the optical detection device 1 according to the present embodiment.

(Light Shielding Structure)

Figure 9A:
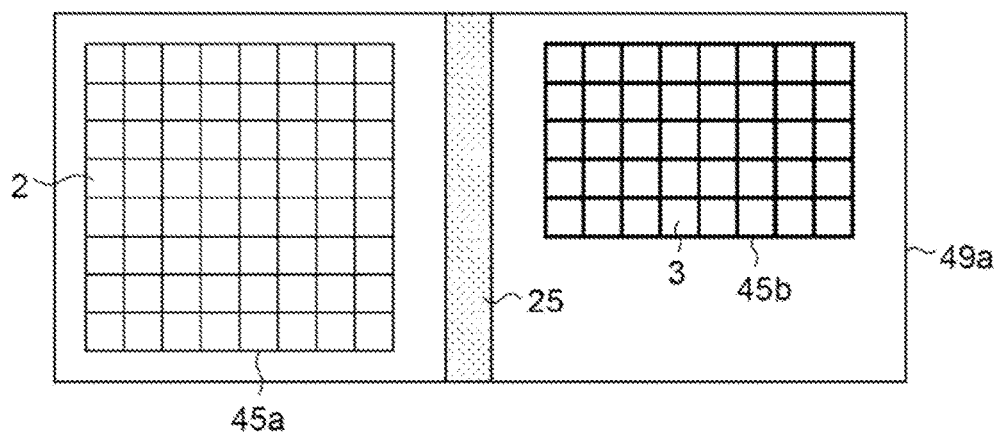
FIG. 9A is a plan diagram depicting a first example of a light shielding structure.

FIG. 9A is a plan diagram depicting a first example of the light shielding structure. According to the light shielding structure in FIG. 9A, the light shielding member 25 is arranged between the first pixel array unit 45*a* including a plurality of imaging pixels 2 and the second pixel array unit 45*b* including a plurality of monitoring pixels 3. The light shielding member 25 extends in a depth direction of the substrate 49*a*, and shields light having passed through a first photoelectric conversion region included in each of the imaging pixels 2, to prevent entrance of the light into a second photoelectric conversion region included in each of the monitoring pixels 3.

Figure 9B:
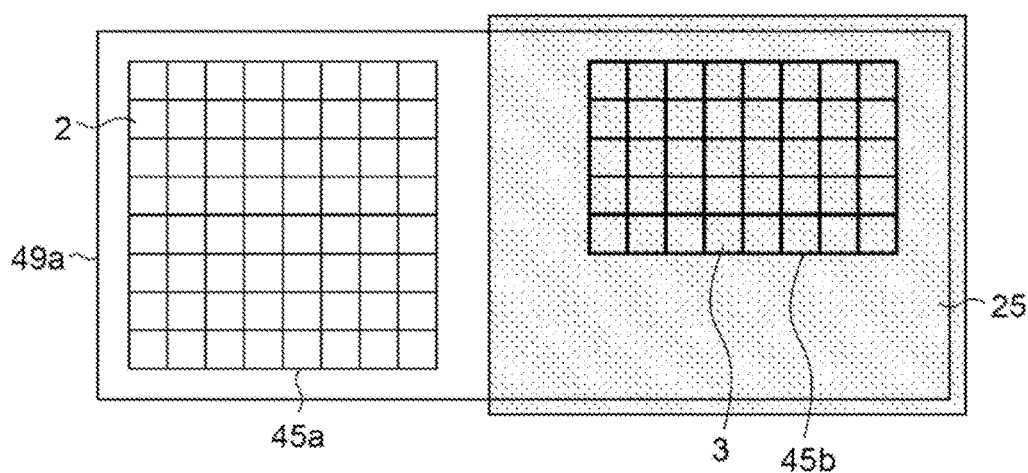
FIG. 9B is a plan diagram depicting a second example of the light shielding structure.

FIG. 9B is a plan diagram depicting a second example of the light shielding structure. According to the light shielding structure in FIG. 9B, the light shielding member 25 is disposed above (in a light entrance direction of) the second pixel array unit 45*b* where a plurality of monitoring pixels 3 are arranged, and covers the entire area of the second pixel array unit 45*b*. In this manner, the light shielding member 25 shields light entering the first pixel array unit 45*a*, and prevents entrance of the light into the second pixel array unit 45*b*.

Figure 9C:
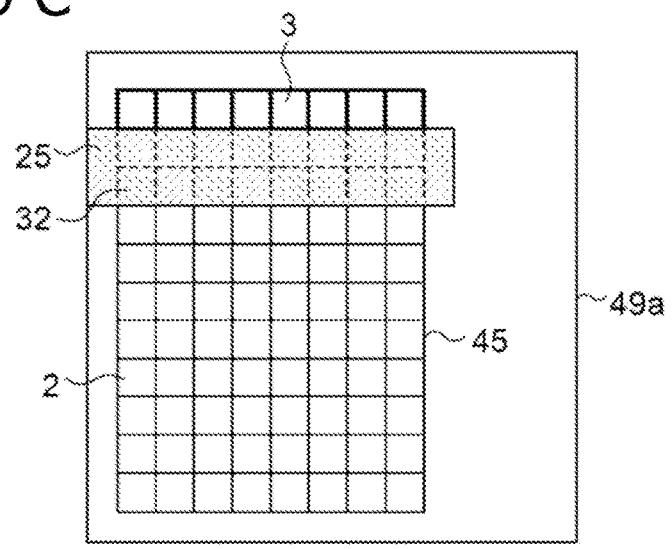
FIG. 9C is a plan diagram depicting a third example of the light shielding structure.

FIG. 9C is a plan diagram depicting a third example of the light shielding structure. According to the light shielding structure in FIG. 9C, a plurality of imaging pixels 2 and a plurality of monitoring pixels 3 are arranged away from each other on the same pixel array unit 45. In addition, the dummy pixels 32 are arranged between the plurality of imaging pixels 2 and the plurality of monitoring pixels 3, for example. The light shielding member 25 is disposed above (in a light entrance direction of) the dummy pixels 32. The light shielding member 25 in FIG. 9C prevents further entrance of light having entered the plurality of imaging pixels 2 into the plurality of monitoring pixels 3.

Figure 9D:
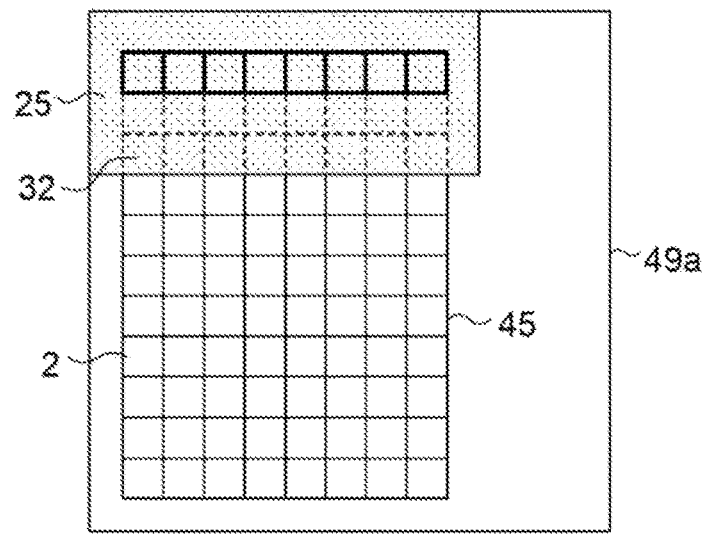
FIG. 9D is a plan diagram depicting a fourth example of the light shielding structure.

FIG. 9D is a plan diagram depicting a fourth example of the light shielding structure. The light shielding structure in FIG. 9D is one modification of FIG. 9C. In this structure, the light shielding member 25 disposed above (in the light entrance direction of) the dummy pixels 32 is so provided as to cover not only the dummy pixels 32, but also a plurality of monitoring pixels 3. Accordingly, the light shielding member 25 in FIG. 9D further prevents entrance of light into the monitoring pixels 3 in comparison with the light shielding member 25 in FIG. 9C, and thus achieves higher light shielding performance.

Figure 9E:
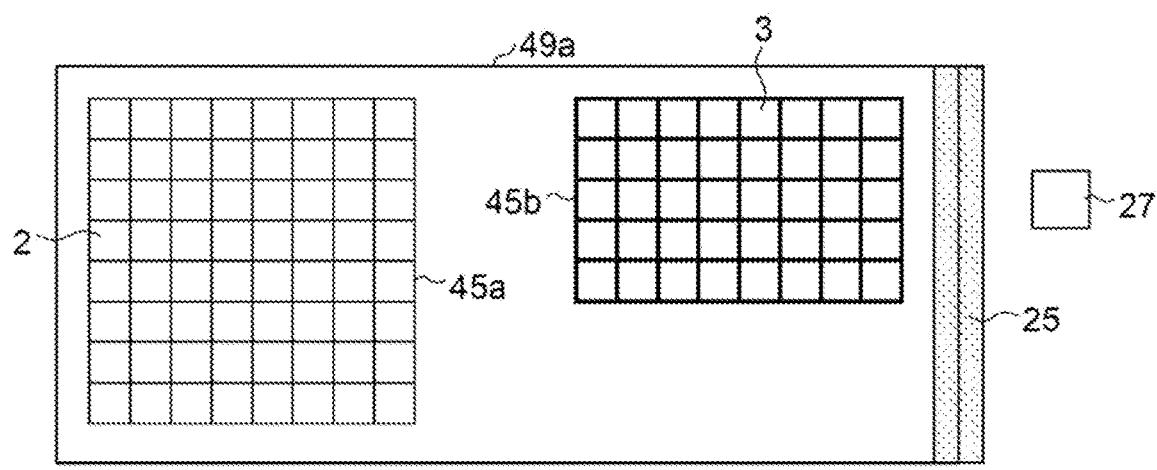
FIG. 9E is a plan diagram depicting a fifth example of the light shielding structure.

FIG. 9E is a plan diagram depicting a fifth example of the light shielding structure. FIG. 9E depicts an example adopting the ToF sensor 26 presented in FIG. 5. In FIG. 9E, the first pixel array unit 45*a* including a plurality of imaging pixels 2 and the second pixel array unit 45*b* including a plurality of monitoring pixels 3 are arranged away from each other. The light shielding member 25 is disposed between the second pixel array unit 45*b* and the light emission unit 27. The light shielding member 25 extends in the depth direction of the substrate 49*a*. Accordingly, light emitted from the light emission unit 27 is shielded by the light shielding member 25 and does not enter the monitoring pixels 3.

(Change of Operation Condition for Monitoring Pixel 3)

Figure 10A:
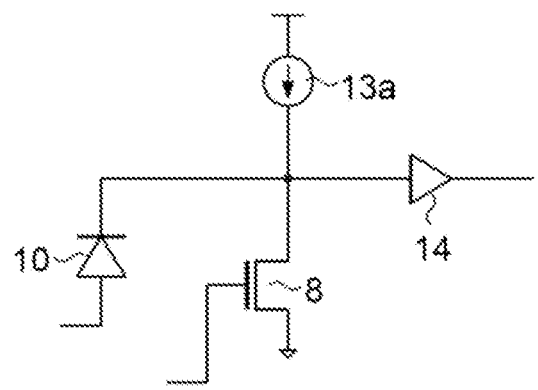
FIG. 10A is a diagram depicting a first example of a change of an operation condition for the monitoring pixel.

The number of times comparison and determination circuit 7 included in the optical detection device 1 in FIG. 1 changes an operation condition for the monitoring pixel 3 in a case where the cathode potential of the carrier generation unit 10 included in the monitoring pixel 3 reaches the bottom potential a predetermined reference number of times. FIG. 10A is a diagram depicting a first example of the change of the operation condition for the monitoring pixel 3. In FIG. 10A, in a case where the number of times reaches a reference number of times, a current source 13*a* that is provided in the monitoring pixel 3 and that includes a PMOS transistor is turned off, for example. In this case, the cathode potential of the carrier generation unit 10 is difficult to rise, and hence, a breakdown of the monitoring pixel 3 is not caused. Alternatively, the cathode potential control circuit 8 including an NMOS transistor and the like may be connected to and between the cathode of the carrier generation unit 10 and a ground node to set the cathode potential of the carrier generation unit 10 to the potential in which the carrier generation unit 10 does not operate in the Geiger mode. The carrier generation unit 10 operates in the Geiger mode when a voltage equal to or higher than a breakdown voltage is applied between the cathode and the anode. Accordingly, the cathode potential control circuit 8 sets the cathode potential to such potential in which a potential difference smaller than the breakdown voltage is given between the cathode and the anode of the carrier generation unit 10.

Figure 10B:
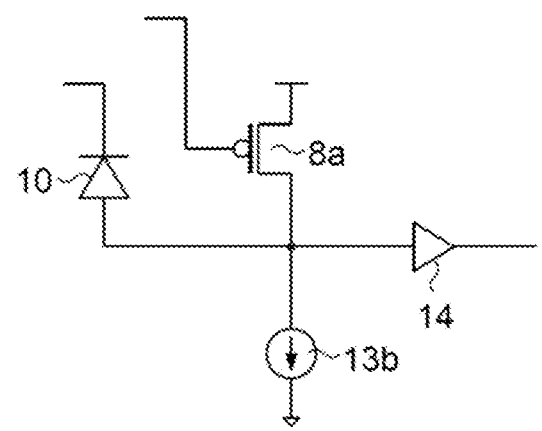
FIG. 10B is a diagram depicting a second example of the change of the operation condition for the monitoring pixel.

FIG. 10B is a diagram depicting a second example of the change of the operation condition of the monitoring pixel 3. The example in FIG. 10B controls the anode potential of the carrier generation unit 10. In FIG. 10B, in a case where the number of times reaches a reference number of times, a current source 13*b* that is provided in the monitoring pixel 3 and that includes an NMOS transistor is turned off, for example. In this case, the anode potential of the carrier generation unit 10 is difficult to lower, and hence, a breakdown of the monitoring pixel 3 is not caused. Alternatively, an anode voltage control circuit 8*a* including a PMOS transistor and the like may be connected to and between the anode of the carrier generation unit 10 and a power source node to set the anode potential of the carrier generation unit 10 to such potential in which the carrier generation unit 10 does not operate in the Geiger mode.

(Processing Operation of Optical Detection Device 1)

As depicted in FIGS. 5 and 6, the optical detection device 1 according to the present embodiment is applicable to the ToF sensor 26. Alternatively, the optical detection device 1 according to the present embodiment is also applicable to use purposes other than the ToF sensor 26. For example, the monitoring pixel 3 may be used for a purpose of adjusting the bias voltage of the photoelectric conversion element 9 included in the imaging pixel 2 provided to detect weak light. Alternatively, the monitoring pixel 3 may be operated independently of the imaging pixel 2.

Figure 11:
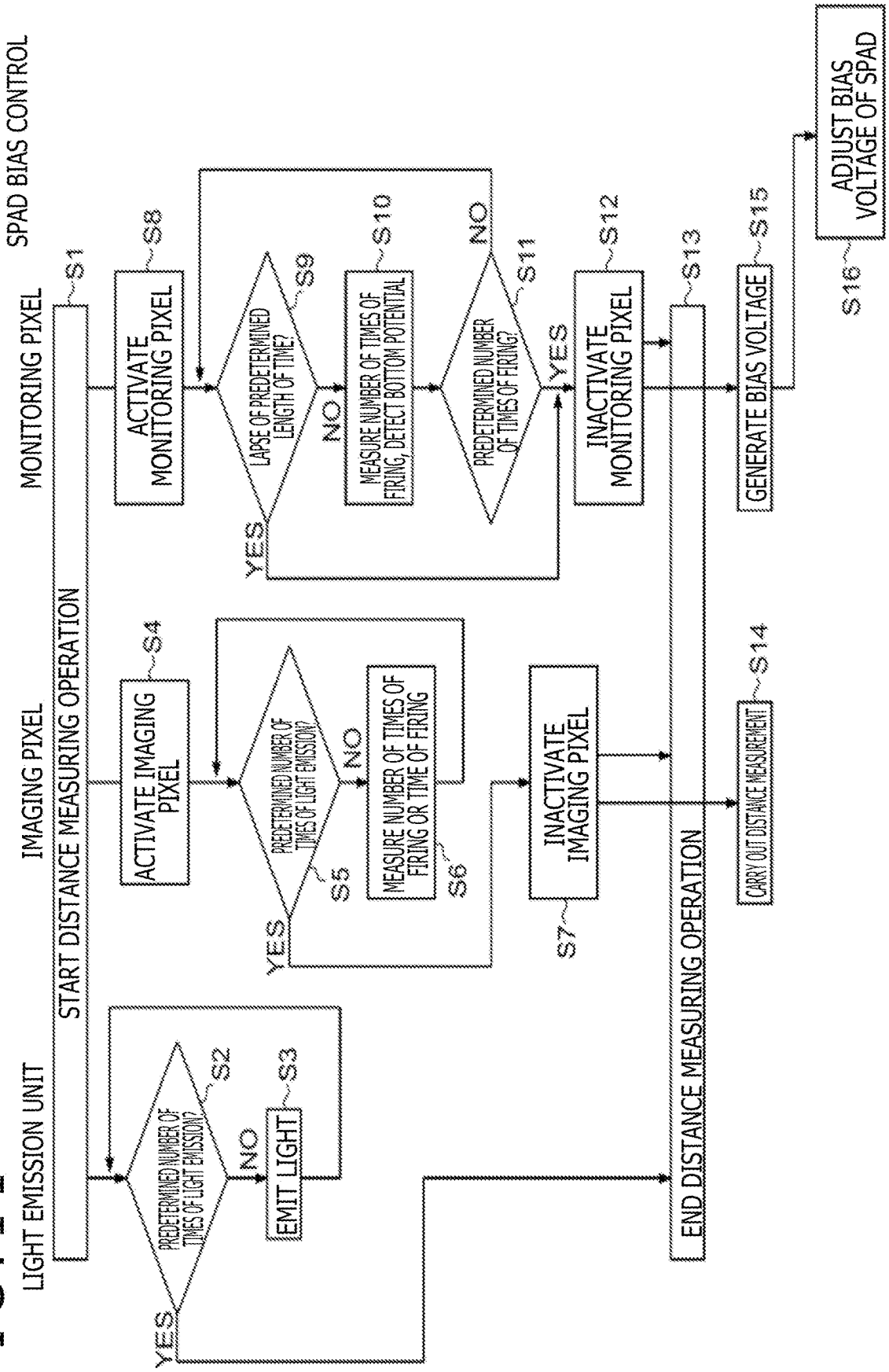
FIG. 11 is a flowchart illustrating a processing operation performed in a case where the monitoring pixel is operated in accordance with an operation of the ToF sensor.

FIG. 11 is a flowchart illustrating a processing operation performed in a case where the monitoring pixel 3 is operated in accordance with an operation of the ToF sensor 26. First, a distance measuring operation is started (step S1). Specifically, a light emission process performed by the light emission unit 27 included in the ToF sensor 26, a pixel signal generation process performed by the imaging pixel 2, and a bias voltage generation process performed by the monitoring pixel 3 are concurrently started.

The light emission unit 27 determines whether or not the number of times of light emission has reached a predetermined number of times (step S2), and cyclically emits pulsed light signals until the number of times reaches a predetermined number of times (step S3).

Meanwhile, the imaging pixel 2 is activated into a state where photoelectric conversion is achievable (step S4). The activation here refers to an action for giving a potential difference equal to or larger than a breakdown voltage between the anode and the cathode of the photoelectric conversion element 9.

Thereafter, it is determined whether or not the number of times of light reception (the number of times of firing) by the photoelectric conversion element 9 included in the imaging pixel 2 has reached a predetermined number of times (step S5). The process for detecting the time or the number of times of firing of the photoelectric conversion element 9 is repeated until the number of times reaches the predetermined number of times (step S6). Note that the firing here refers to a state where the photoelectric conversion element 9 receives a photon and causes a breakdown. If it is determined that the number of times has reached the predetermined number of times in step S5, the imaging pixel 2 is inactivated (step S7). The inactivation here refers to an action for giving a potential difference smaller than a breakdown voltage between the anode and the cathode of the photoelectric conversion element 9.

Meanwhile, the monitoring pixel 3 is activated into a state where a carrier is detectable (step S8), and it is determined whether or not a predetermined length of time has elapsed (step S9). Before the lapse of the predetermined length of time, the number of times of firing of the carrier generation unit 10 is counted, and a state where the cathode of the carrier generation unit 10 has become the bottom potential is detected (step S10). Subsequently, it is determined whether or not the number of times of firing has reached a predetermined number of times (step S11). Until the predetermined number of times is reached, the processes in step S9 and the following steps are repeated. In a case where the number of times has reached the predetermined number of times, or in a case of a determination that the predetermined length of time has elapsed in step S9, the monitoring pixel 3 is inactivated (step S12).

In a case of a determination that light emission has been performed the predetermined number of times in step S2, or after completion of step S7 or S12, the distance measuring operation ends (step S13).

Next, distance measurement is carried out according to the time at which the light emission unit 27 has emitted the light signal and the time at which the photoelectric conversion element 9 has fired in step S6 (step S14). Concurrently with the process in step S14, the control circuit 8 performs such processing as averaging and AD conversion of the bottom potential of the cathode of the carrier generation unit 10 to generate a bias voltage (e.g., anode potential) of each of the photoelectric conversion element 9 and the carrier generation unit 10 (step S15). Subsequently, the bias voltage (e.g., anode potential) of each of the photoelectric conversion element 9 and the carrier generation unit 10 is adjusted (step S16).

Figure 12:
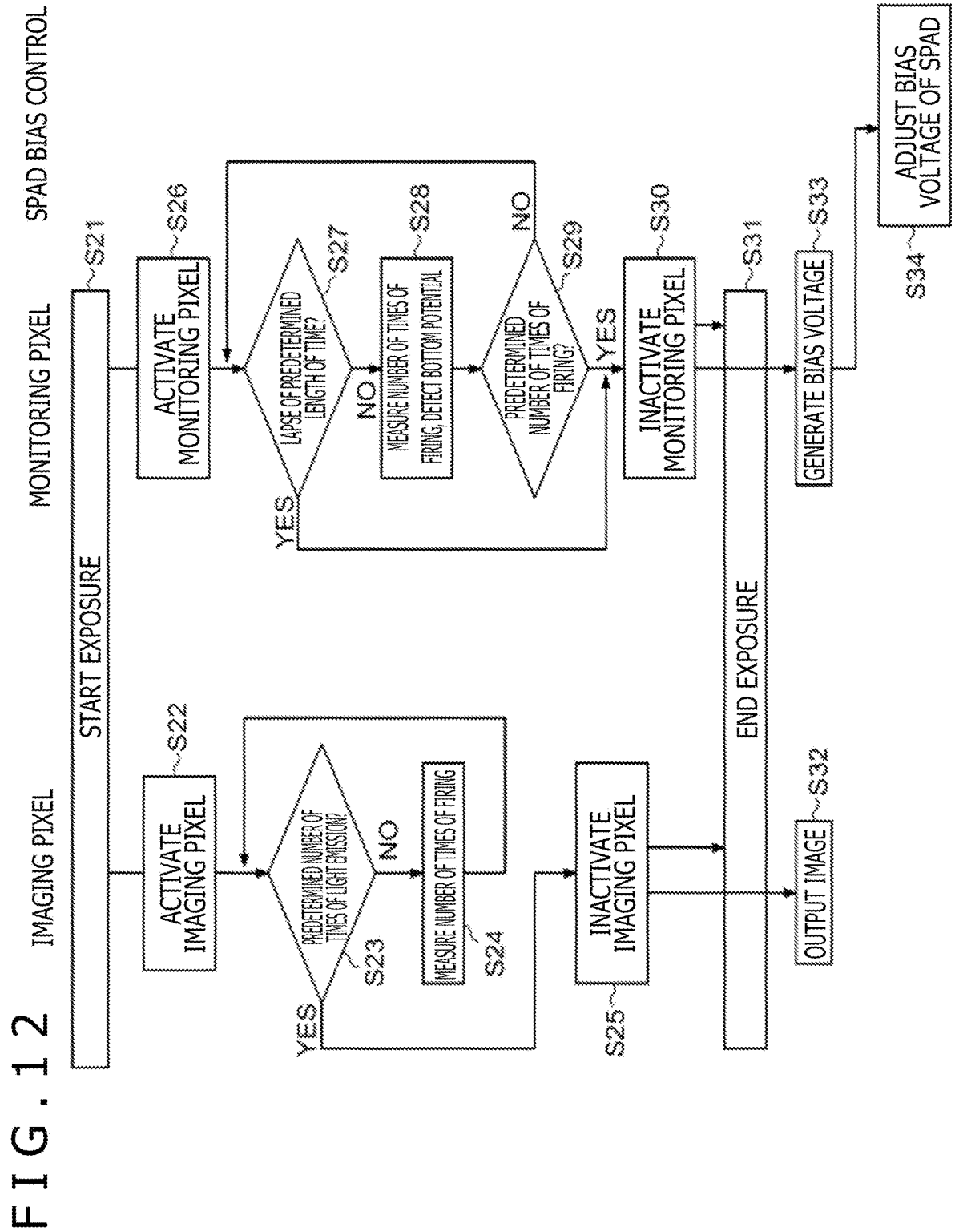
FIG. 12 is a flowchart illustrating a processing operation performed in a case where the imaging pixel and the monitoring pixel are concurrently operated.

FIG. 12 is a flowchart illustrating a processing operation performed in a case where the imaging pixel 2 and the monitoring pixel 3 are concurrently operated. The processing operation in FIG. 12 is not an operation applied to the ToF sensor 26, but an operation for adjusting a bias voltage of the photoelectric conversion element 9 at the time of light detection by the imaging pixel 2.

First, the imaging pixel 2 and the monitoring pixel 3 concurrently start an exposure operation (step S21). The imaging pixel 2 performs actions similar to those in steps S4 to S7 in FIG. 11 to count the number of times of firing by the photoelectric conversion element 9 (steps S22 to S25). In step S24, the time of firing by the photoelectric conversion element 9 need not be detected, and only the number of times of firing is required to be counted.

The monitoring pixel 3 performs actions similar to those in steps S8 to S12 in FIG. 11 to detect the number of times of firing by the carrier generation unit 10 and the bottom potential of the cathode of the carrier generation unit 10 (steps S26 to S30).

After completion of the processes in steps S25 and S30, exposure ends (step S31), and a pixel signal generated by the imaging pixel 2 is output (step S32). Concurrently with the process in step S32, the control circuit 8 performs a process for adjusting a bias voltage (e.g., anode potential) of each of the photoelectric conversion element 9 and the carrier generation unit 10 (steps S33 and S34) as in steps S15 and S16 in FIG. 11.

Figure 13:
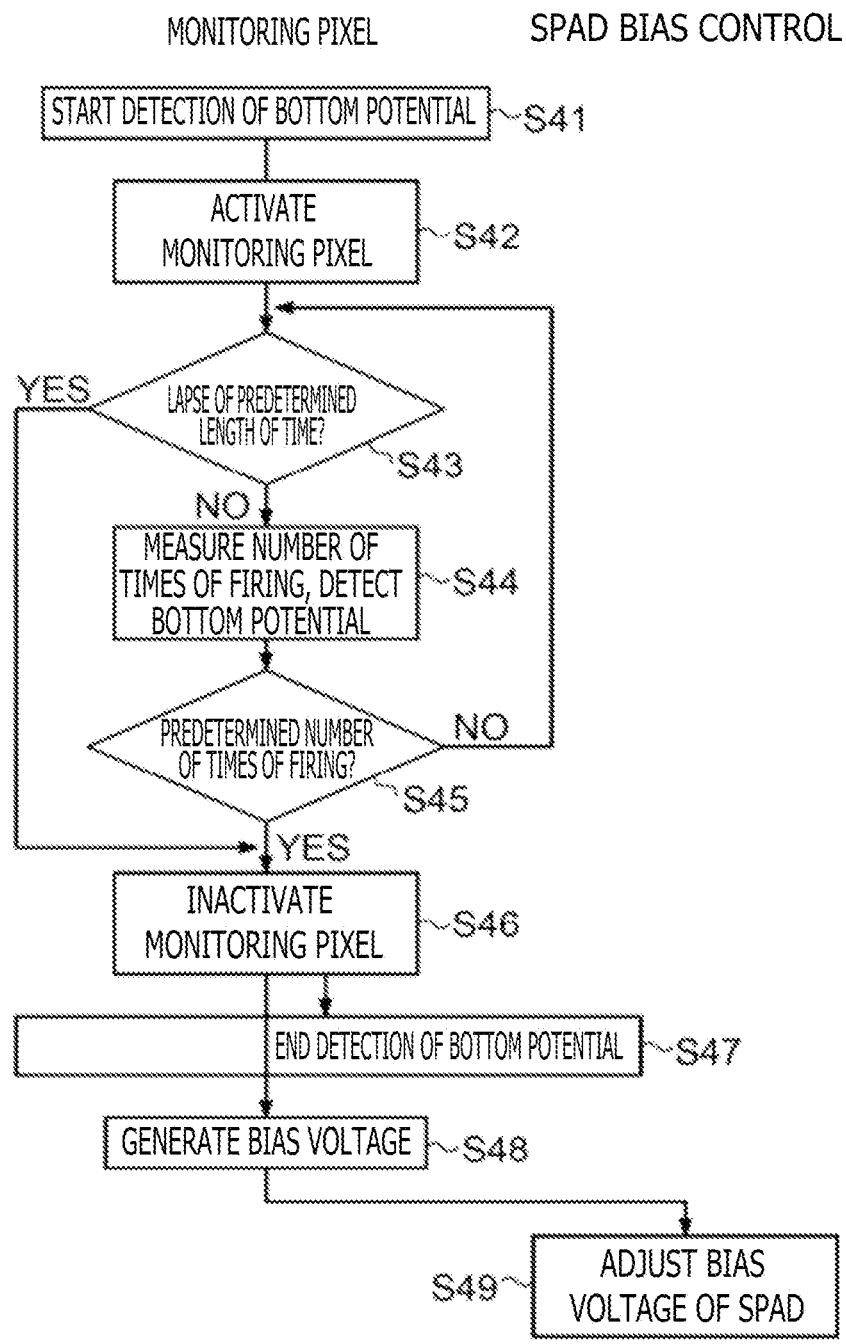
FIG. 13 is a flowchart illustrating a processing operation performed by the monitoring pixel to achieve an action independently of the imaging pixel.

FIG. 13 is a flowchart illustrating a processing operation performed by the monitoring pixel 3 to achieve an action independently of the imaging pixel 2. The monitoring pixel 3 performs actions (steps S41 to S49) similar to those in steps S8 to S13, S15, and S16 in FIG. 11. In this manner, the monitoring pixel 3 is allowed to detect the bottom potential of the cathode of the carrier generation unit 10 independently of the imaging pixel 2, and control the bias voltage (e.g., anode potential) of the carrier generation unit 10 in reference to the detected bottom potential.

As described above, according to the first embodiment, the monitoring pixel 3 is provided separately from the imaging pixel 2. The carrier generation unit 10 included in the monitoring pixel 3 generates a carrier by a cause other than photoelectric conversion to cause a breakdown according to the generated carrier. The bottom potential of the cathode at the time when the carrier generation unit 10 causes a breakdown is detected. A bias voltage (e.g., anode potential) of each of the photoelectric conversion element 9 included in the imaging pixel 2 and the carrier generation unit 10 included in the monitoring pixel 3 is adjusted in reference to the detected bottom potential. In this manner, a possibility of variations of the bias voltage by a quantity of incident light into the monitoring pixel 3 is eliminated. As a result, the bias voltage is stabilized.

Moreover, according to the present embodiment, the operation condition for the monitoring pixel 3 is changed in a case where a bias voltage of each of the photoelectric conversion element 9 and the carrier generation unit 10 is generated by the carrier generation unit 10 within the monitoring pixel 3 being caused to fire a predetermined number of times. In this manner, power consumption by the monitoring pixel 3 can be reduced.

Furthermore, the light shielding member 25 is so disposed as to prevent entrance of light into the monitoring pixel 3. Accordingly, variations of a bias voltage generated using the monitoring pixel 3 can be reduced.

Second Embodiment

As explained in the first embodiment, the structure of the imaging pixel 2 and the structure of the monitoring pixel 3 differ from each other. According to this difference in structure, the imaging pixel 2 performs photoelectric conversion corresponding to incident light, while the monitoring pixel 3 generates a carrier by a cause other than photoelectric conversion. A second embodiment described below explicitly presents a specific example of the structure of the monitoring pixel 3.

In FIG. 3B, the pinning film (second pinning film) 55 on the side opposite to the wiring layer is partially removed to generate a carrier (e.g., electron) by dark current. Dark current is more easily generable as the removal size of the pinning film 55 increases. However, the removal position, the removal size, and the removal shape of the pinning film 55 may be any position, size, and shape. While described below will be an example in which the pinning film 55 on a surface opposite to the wiring layer (a surface corresponding to the light entrance surface) is partially removed, for example, the pinning film 55 on a surface along the pixel separation portion 63 may be partially removed.

Figure 14A:
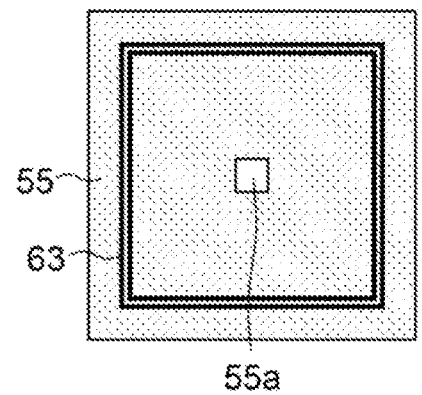
FIG. 14A is a plan diagram depicting a first example of a pinning film.
Figure 14B:
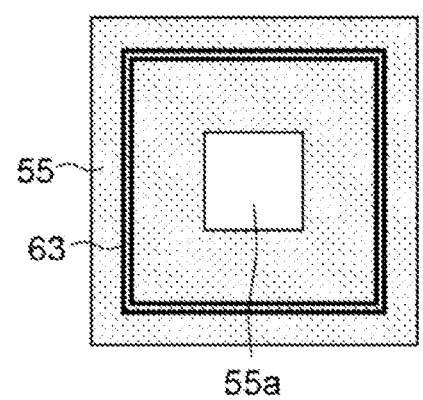
FIG. 14B is a plan diagram depicting a second example of the pinning film.

FIG. 14A is a plan diagram depicting a first example of the pinning film 55, while FIG. 14B is a plan diagram depicting a second example of the pinning film 55. FIG. 14A depicts the pinning film 55 of one pixel. The pixel separation portion 63 is provided on a portion near an outer circumference of the pinning film 55. In FIG. 14A, a substantially central portion of the pinning film 55 is removed in a rectangular shape 55a. The removed rectangular size 55a may have any size. For example, the pinning film 55 may be removed by the size 55a that is approximately one third of one side of one pixel as depicted in FIG. 14B. When the pinning film 55 is partially removed, dark current is more easily generated in the removed portion than in the not-removed portion. Electrons generated by dark current are attracted toward the cathode in the carrier generation unit 10. In this case, the electrons are multiplied in the avalanche multiplication region 57, and a breakdown is caused by the carrier generation unit 10.

Figure 14C:
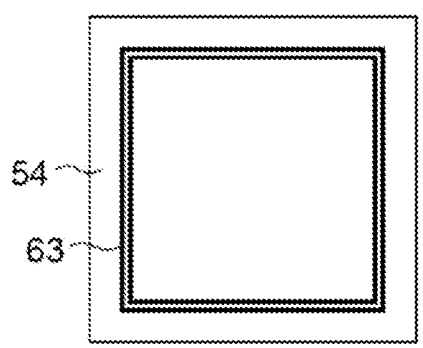
FIG. 14C is a plan diagram in which the entire pinning film on the side opposite to a wiring layer is removed.

Dark current is more easily generable as the area of the pinning film 55 in contact with the hole accumulation layer 54 in FIG. 3B decreases. Accordingly, for example, the entire pinning film 55 on the surface opposite to the wiring layer may be removed as depicted in FIG. 14C. According to the example depicted in FIG. 14C, the hole accumulation layer 54 is exposed as a result of removal of the pinning film 55 on the surface opposite to the wiring layer.

Figure 14D:
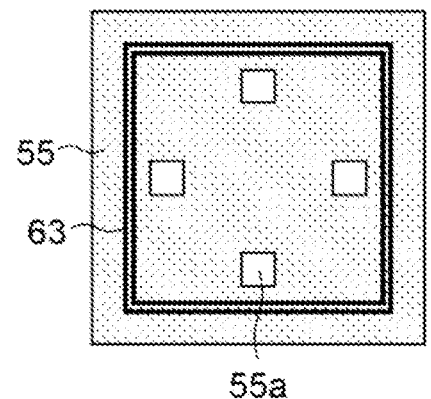
FIG. 14D is a plan diagram in a case where partial removal portions are provided at a plurality of positions within the pinning film.

Moreover, as depicted in FIG. 14D, the removal portions 55a as partial portions may be provided at a plurality of positions inside the pinning film 55. The configuration including the removal portions 55a at the plurality of positions inside the pinning film 55 can generate carriers at a plurality of positions inside the photoelectric conversion region of the carrier generation unit 10, and hence can improve carrier detection efficiency.

Figure 14E:
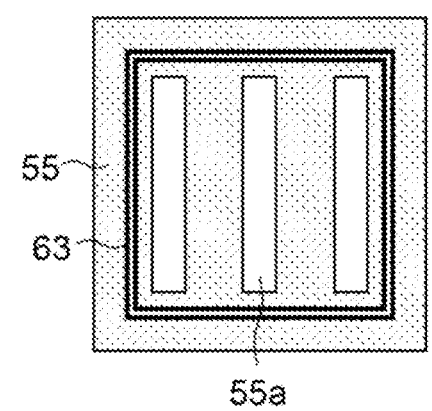
FIG. 14E is a plan diagram in a case where a slit-shaped removal portion is provided in the pinning film.

In addition, each of the removal portions 55a may have a slit shape as depicted in FIG. 14E instead of the rectangular shape.

Figure 14F:
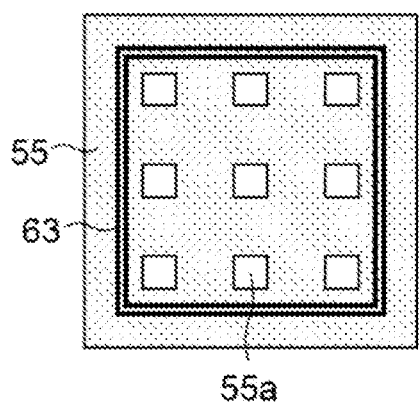
FIG. 14F is a plan diagram in a case where a plurality of removal portions are provided equally in left, right, up, and down directions within the pinning film.
Figure 14G:
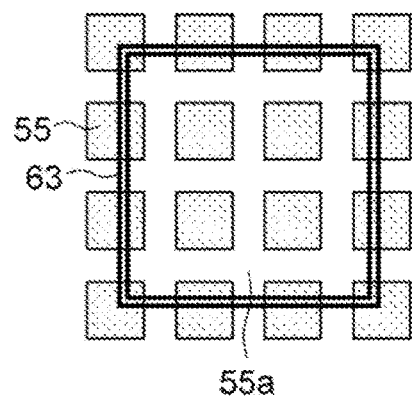
FIG. 14G is a plan diagram in a case where a mesh-shaped removal portion is provided within the pinning film.

Alternatively, as depicted in FIG. 14F, a plurality of rectangular removal portions 55a may be arranged equally in left, right, up, and down directions. Alternatively, as depicted in FIG. 14G, the removal portion 55a having a mesh shape may be provided inside the pinning film 55.

As described above, carriers are easily generated by dark current at the portion 55a from which the pinning film 55 is removed. For generating more carriers, damage by plasma may be given to the portion 55a from which the pinning film 55 is removed, to form an interface state.

Figure 15:
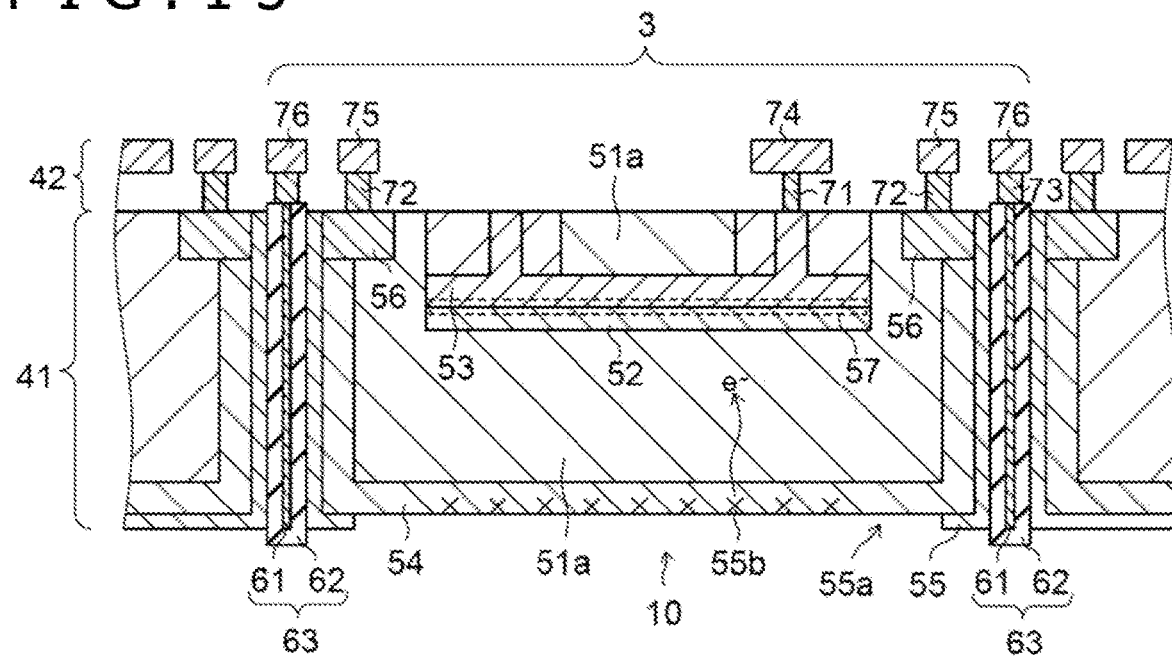
FIG. 15 is a cross-sectional diagram of a carrier generation unit according to one modification of a second embodiment.

FIG. 15 is a cross-sectional diagram of the carrier generation unit 10 according to one modification of the second embodiment. In FIG. 15, a P-well 51a is provided instead of the N-well 51 in FIG. 3B. Moreover, constituent parts included in FIG. 15 and identical to the corresponding parts in FIG. 3B are given identical reference numbers, and different points will mainly be explained below.

While the entire pinning film 55 on the surface opposite to the wiring layer is removed from the carrier generation unit 10 depicted in the example of FIG. 15, only a part of the pinning film 55 on the surface opposite to the wiring layer may be removed.

In FIG. 15, ions contained in plasma are caused to collide with a portion from which the pinning film 55 has been removed, to damage this portion and generate an interface state 55b. The interface state 55b here constitutes a carrier generation source. Accordingly, the carrier generation unit 10 causes a breakdown by a carrier generated by the interface state 55b formed in the vicinity of the surface opposite to the wiring layer.

Formation of the interface state 55b by damage caused by plasma is applicable to any one of FIGS. 14A to 14G. In the configuration which includes the interface state 55b formed at the portion from which the pinning film 55 has been removed, carriers can be generated more easily, and hence, a breakdown of the carrier generation unit 10 can be caused more easily.

As described above, according to the second embodiment, the pinning film 55 of the carrier generation unit 10 included in the monitoring pixel 3 is partially removed. This configuration achieves carrier generation by a cause other than photoelectric conversion. The partial removal of the pinning film 55 is relatively easily achievable by etching. In this case, the monitoring pixel 3 is formable by the same manufacturing step as that of the imaging pixel 2, and thus is easily manufacturable. Moreover, partial removal of the pinning film 55 in a size optimal for causing a breakdown of the carrier generation unit 10 included in the monitoring pixel 3 is also relatively easily achievable.

Furthermore, according to the second embodiment, the interface state 55b is formable by damage caused by plasma at the portion from which the pinning film 55 has been removed. This configuration achieves generation of more carriers, and hence achieves a breakdown of the carrier generation unit 10 more easily.

Third Embodiment

According to a third embodiment, the carrier generation unit 10 included in the monitoring pixel 3 generates a carrier by a cause other than photoelectric conversion with use of a structural characteristic other than partial removal of the pinning film 55.

Figure 16:
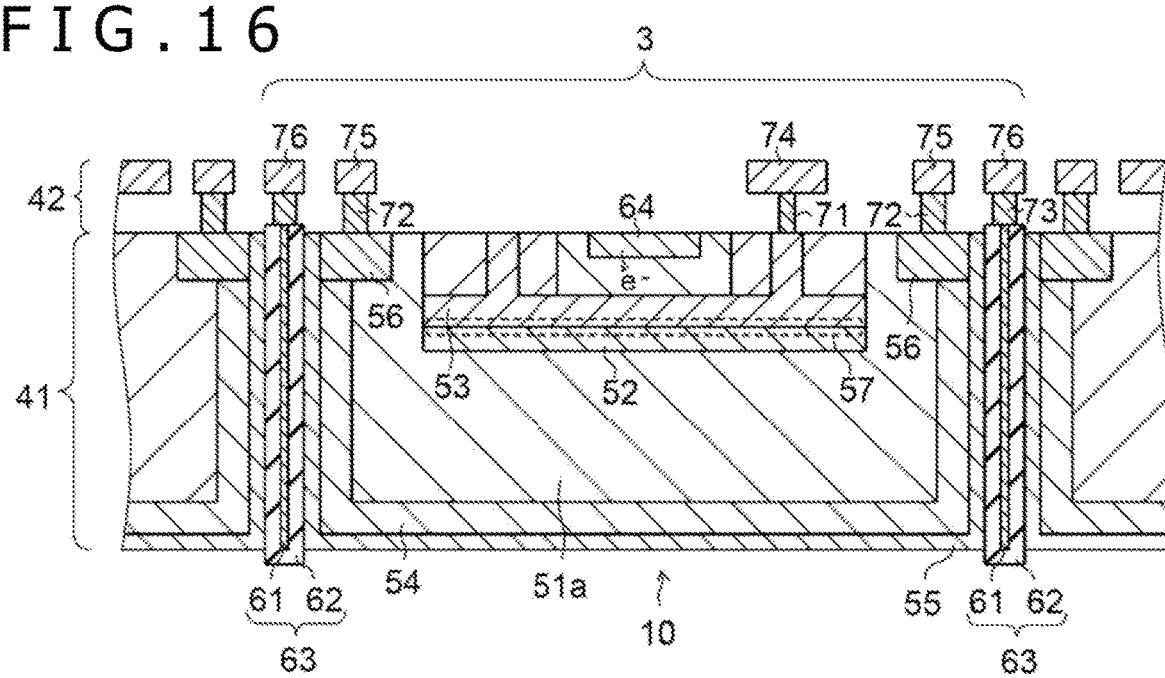
FIG. 16 is a cross-sectional diagram of a carrier generation unit according to a third embodiment.

FIG. 16 is a cross-sectional diagram of the carrier generation unit 10 according to the third embodiment. In FIG. 16 and FIGS. 18 to 24 referred to below, the P-well 51a is provided instead of the N-well 51 in FIG. 3B. Moreover, constituent parts included in FIGS. 16 to 24 and identical to the corresponding parts in FIG. 3B are given identical reference signs, and different points will mainly be explained in the following description.

The carrier generation unit 10 in FIG. 16 includes a high concentration impurity region 64 in a floating state inside the P-well Sla on the wiring layer 42 side. For example, the high concentration impurity region 64 here is a region where P-type impurity ions are implanted from the wiring layer 42 and diffused. The high concentration impurity region 64 thus provided allows many electrons to be attracted toward the cathode, and hence improves electron detection efficiency.

The high concentration P-type diffusion layer 56 is originally formed on the hole accumulation layer 54 near the wiring layer 42 to connect with the contact electrode 72. In this case, the high concentration impurity region 64 described above can be formed during a step of forming the foregoing high concentration P-type diffusion layer 56. Accordingly, this configuration eliminates the necessity of providing an additional manufacturing step for forming the high concentration impurity region 64 in FIG. 16. The carrier generation unit 10 in FIG. 16 is thus manufacturable without changing the manufacturing process.

A plurality of other structures for generating a carrier by a cause other than photoelectric conversion are adoptable in addition to the structure in FIG. 16. Typical structures in these structures will sequentially be explained in the following description.

Figure 17:
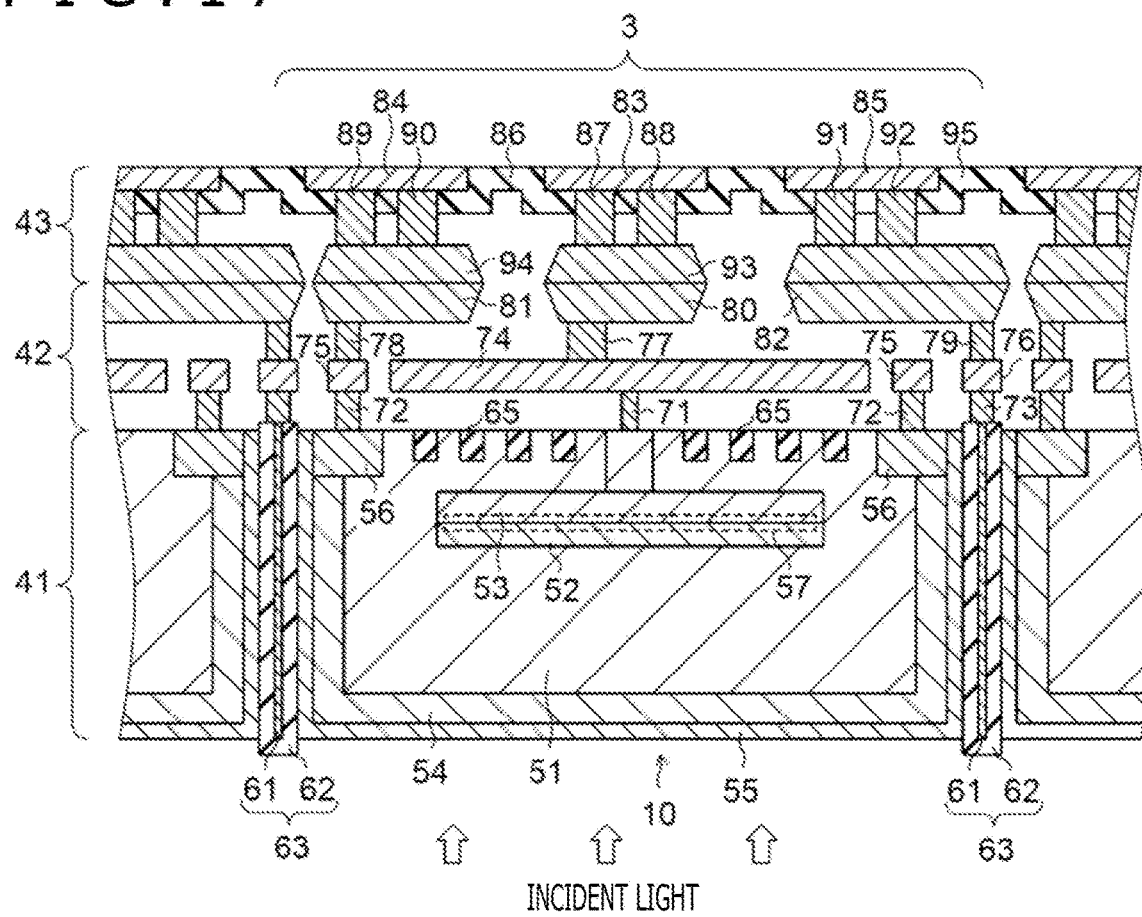
FIG. 17 is a cross-sectional diagram of a carrier generation unit according to a first modification of the third embodiment.

FIG. 17 is a cross-sectional diagram of the carrier generation unit 10 according to a first modification of the third embodiment. The carrier generation unit 10 in FIG. 17 includes a recessed and protruded structure 65 provided at a position overlapping, in a lamination direction, with the avalanche multiplication region 57 (also called intense electric field region) which is a depletion layer formed in a region of connection between the P-type diffusion layer 52 and the N-type diffusion layer 53.

The recessed and protruded structure 65 is produced by forming a plurality of trenches inside the N-well 51 disposed closer to the wiring layer 42 than the avalanche multiplication region 57, and filling interiors of these trenches with an insulation material, for example. The recessed and protruded structure 65 and the avalanche multiplication region 57 are so disposed as to overlap with each other as viewed in the lamination direction. In addition, the recessed and protruded structure 65 may be provided within a region of the N-type diffusion layer 53.

Electrons are generated from an interface between the insulation material included in the recessed and protruded structure 65 and the N-well 51. The generated electrons are attracted toward the cathode. Accordingly, this configuration improves electron detection efficiency, and more easily causes a breakdown of the carrier generation unit 10.

Figure 18A:
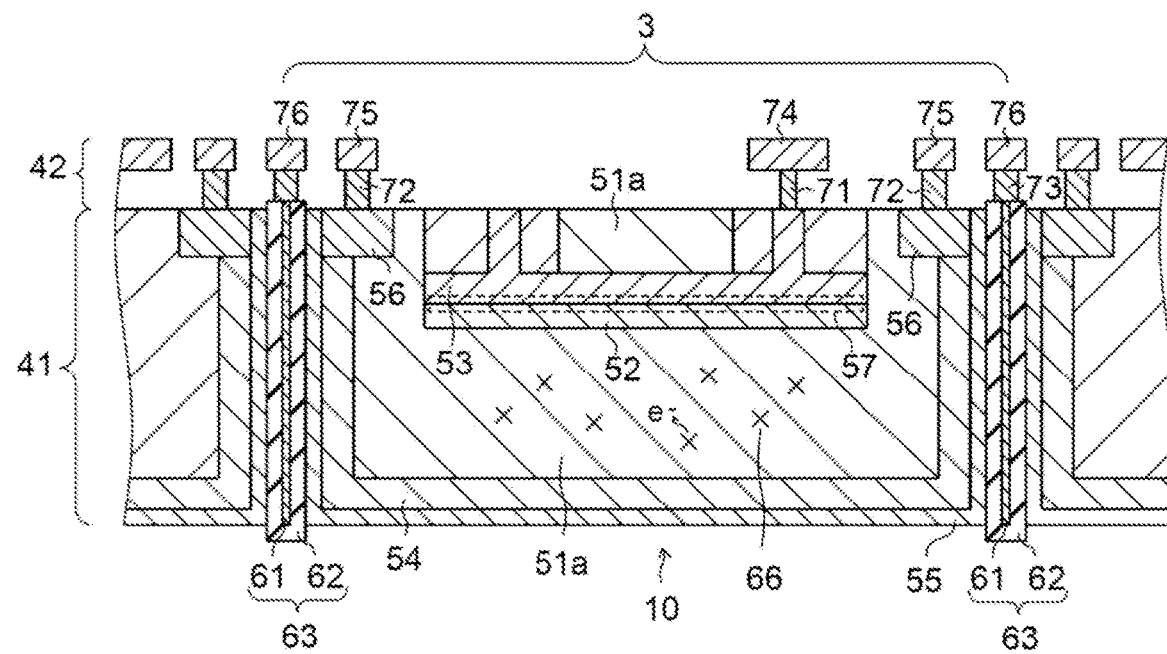
FIG. 18A is a cross-sectional diagram of a carrier generation unit according to a second modification of the third embodiment.
Figure 18B:
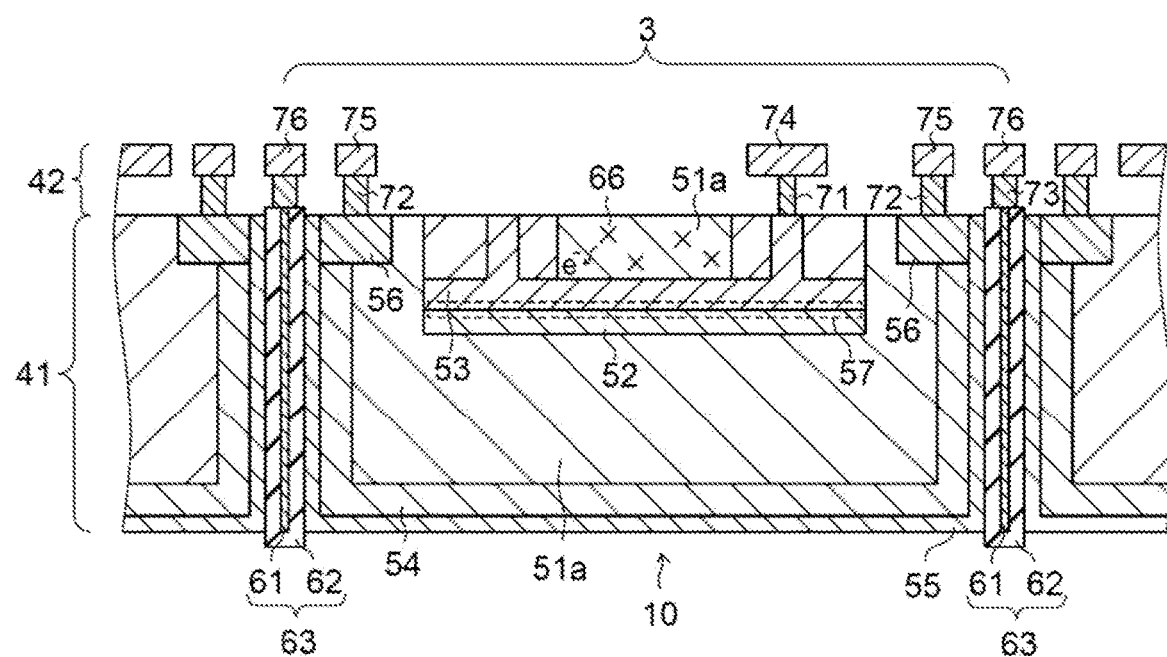
FIG. 18B is a cross-sectional diagram according to one modification of FIG. 18A.

FIGS. 18A and 18B are cross-sectional diagrams of the carrier generation unit 10 in a second modification of the third embodiment. In both of FIGS. 18A and 18B, crystal defects 66 formed in a partial region of the carrier generation unit 10 are designated as carrier generation sources. The crystal defects 66 can be formed relatively easily by implanting silicon, argon, or the like into a photoelectric conversion region including silicon, for example.

In FIGS. 18A and 18B, each of the positions of the crystal defects 66 is schematically clearly indicated as "$\alpha$." FIG. 18A depicts an example where the crystal defects 66 are formed inside the P-well 51a on the side opposite to the wiring layer 42, while FIG. 18B depicts an example where the crystal defects 66 are formed inside the P-well 51a near the wiring layer 42. In both of the cases of FIGS. 18A and 18B, electrons are generated at the positions of the crystal defects 66. The generated electrons are attracted toward the cathode, and allow the carrier generation unit 10 to cause a breakdown.

Figure 19A:
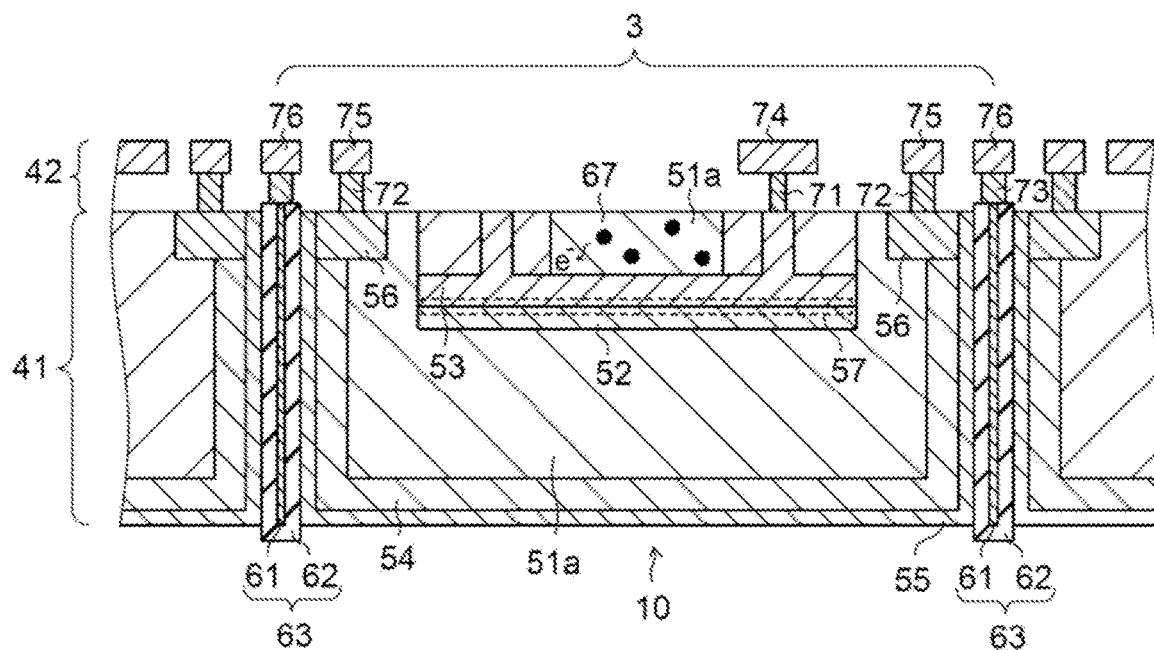
FIG. 19A is a cross-sectional diagram of a carrier generation unit according to a third modification of the third embodiment.
Figure 19B:
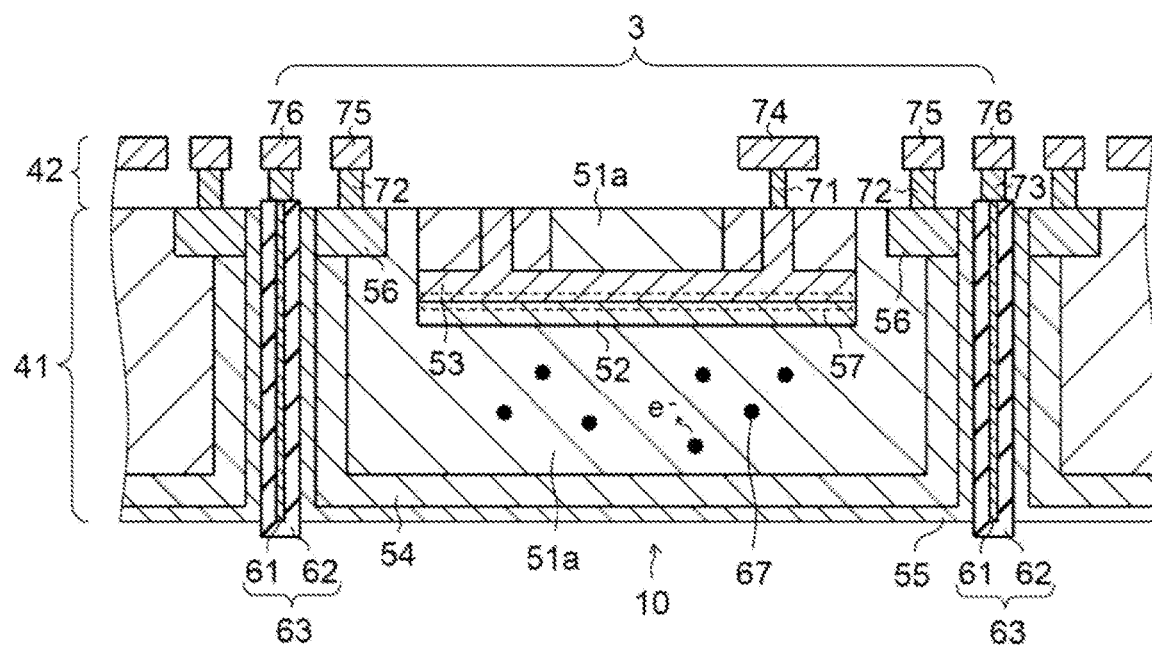
FIG. 19B is a cross-sectional diagram according to one modification of FIG. 19A.

FIGS. 19A and 19B are cross-sectional diagrams of the carrier generation unit 10 in a third modification of the third embodiment. In both of FIGS. 19A and 19B, heavy metal 67 contained in a partial region of the carrier generation unit 10 is designated as a carrier generation source. The heavy metal 67 is metal having specific gravity of 4 or higher, such as molybdenum (Mo) and yttrium (It). The heavy metal 67 can be implanted into the partial region of the carrier generation unit 10 by ion implantation, sputtering, or other methods. The heavy metal 67 generates electrons. FIG. 19A depicts an example of the heavy metal 67 implanted into the P-well 51a on the wiring layer 42 side, while FIG. 19B depicts an example of the heavy metal 67 implanted into the P-well 51a on the light entrance surface side.

The electrons generated by the heavy metal 67 are attracted toward the cathode, and allow the carrier generation unit 10 to cause a breakdown.

Figure 20:
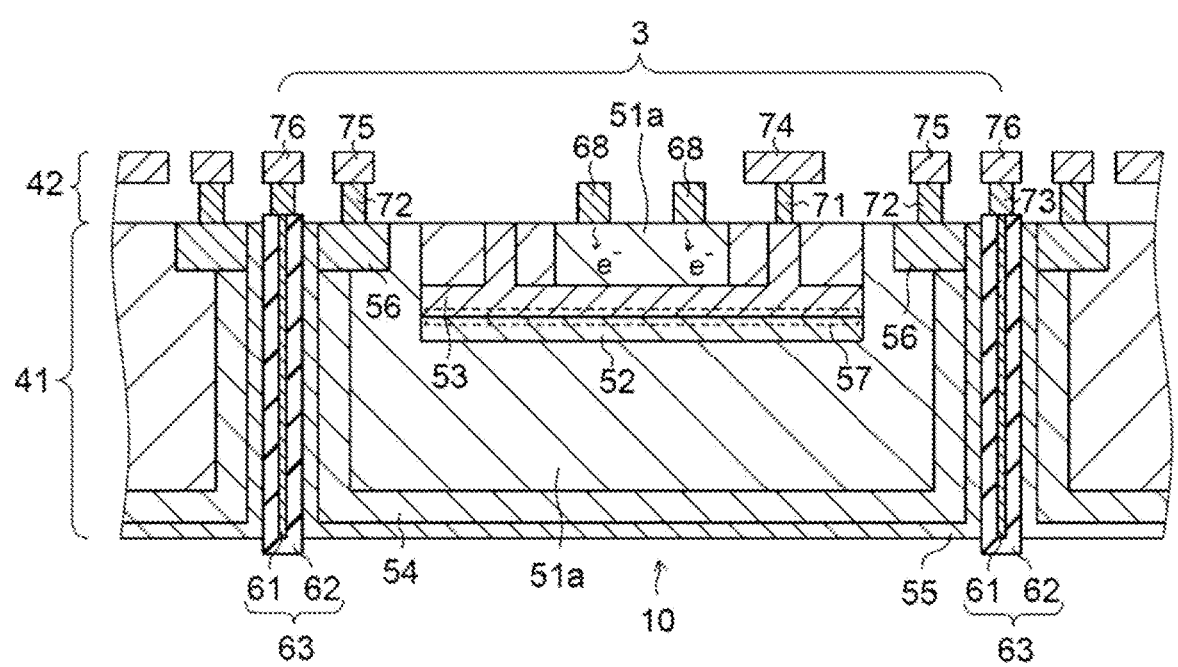
FIG. 20 is a cross-sectional diagram of a carrier generation unit according to a fourth modification of the third embodiment.

FIG. 20 is a cross-sectional diagram of the carrier generation unit 10 in a fourth modification of the third embodiment. In FIG. 20, a contact electrode 68 in a floating state is formed inside the P-well 51a on the wiring layer 42 side during formation of the contact electrode 71 for cathode connection, the contact electrode 72 for anode connection, and the like. Accordingly, an additional manufacturing step need not be performed to form the contact electrode 68. The contact electrode 68 here is in a floating state, and generates electrons. The generated electrons are attracted toward the cathode, and allow the carrier generation unit 10 to cause a breakdown. The contact electrode 68 may have a larger size than the contact electrode 71 for cathode connection and the contact electrode 72 for anode connection. This configuration can increase a quantity of the generated electrons. Note that a plurality of contact electrodes 68 in a floating state may be provided.

Figure 21A:
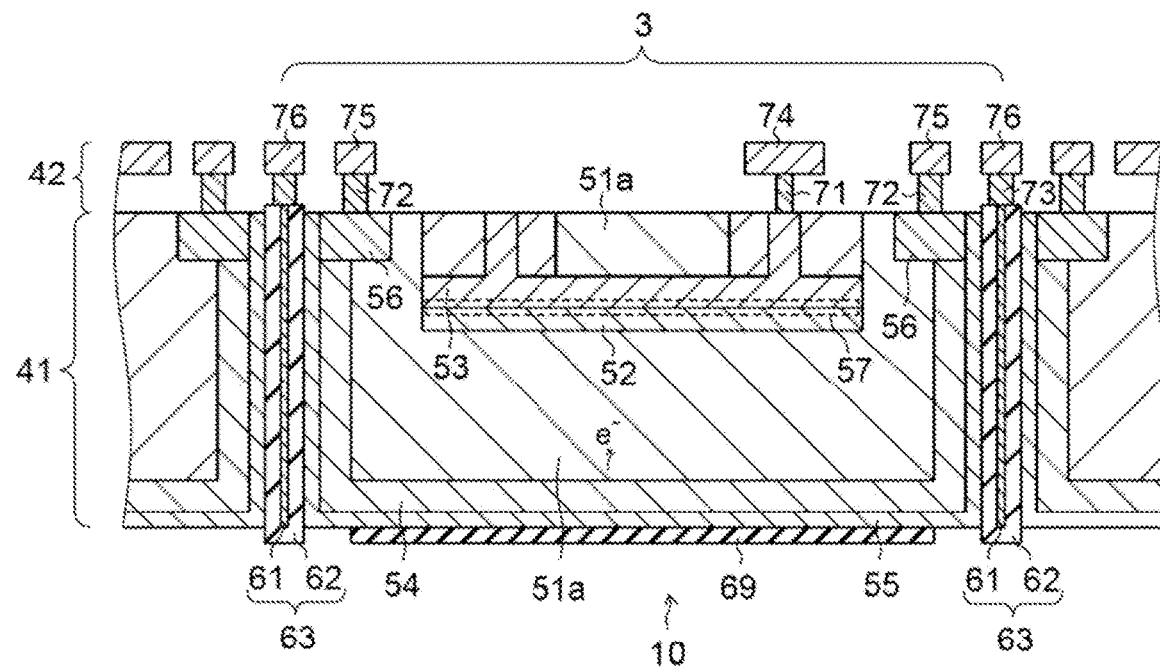
FIG. 21A is a cross-sectional diagram of a carrier generation unit according to a fifth modification of the third embodiment.
Figure 21B:
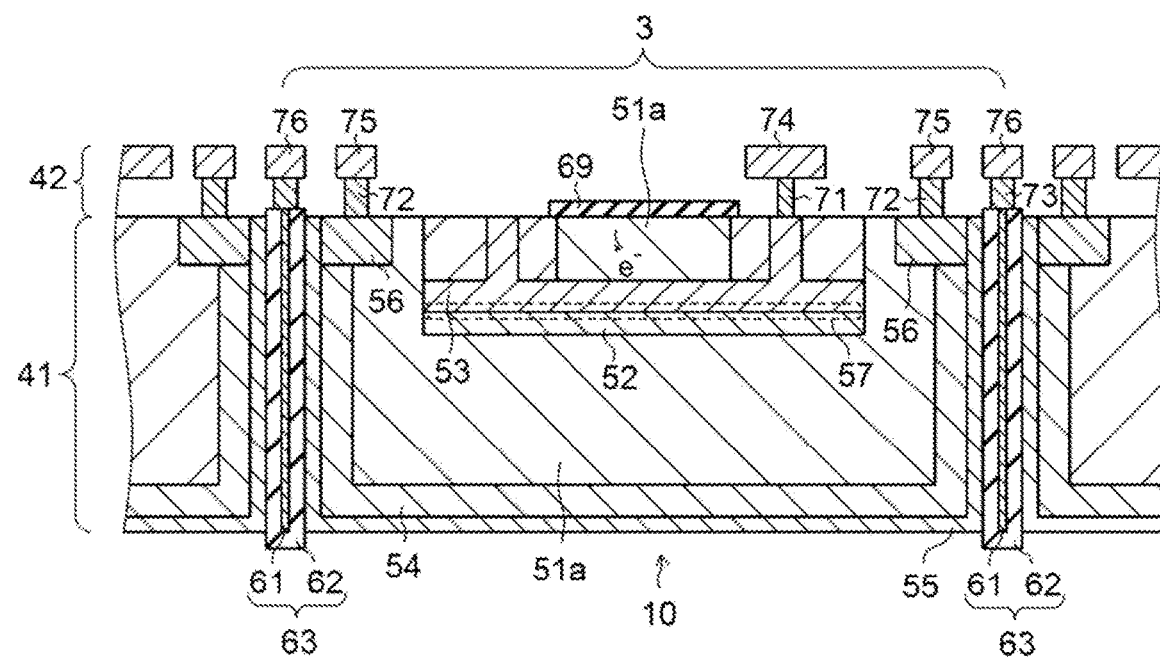
FIG. 21B is a cross-sectional diagram according to one modification of FIG. 21A.

FIGS. 21A and 21B are cross-sectional diagrams of the carrier generation unit 10 in a fifth modification of the third embodiment. When stress is applied to the photoelectric conversion region of the carrier generation unit 10, the photoelectric conversion region is distorted. As a result, carriers (e.g., electrons) are generated. In the fifth modification, hence, a stress applying member 69 is disposed at a position in contact with the P-well 51a corresponding to the photoelectric conversion region. The stress applying member 69 is a member which applies stress to the P-well 51a. FIG. 21A depicts an example where the stress applying member 69 is in contact with an end face of the P-well 51a on the side opposite to the wiring layer 42, while FIG. 21B depicts an example where the stress applying member 69 is in contact with an end face of the P-well 51a on the wiring layer 42 side.

In both of the cases of FIGS. 21A and 21B, stress is generated inside the P-well 51a by the contact between the stress applying member 69 and the P-well 51a. As a result, distortion is caused, and carriers (e.g., electrons) can be generated in association with this distortion. The generated carriers are attracted toward the cathode. Accordingly, carrier detection efficiency is allowed to improve.

Figure 22:
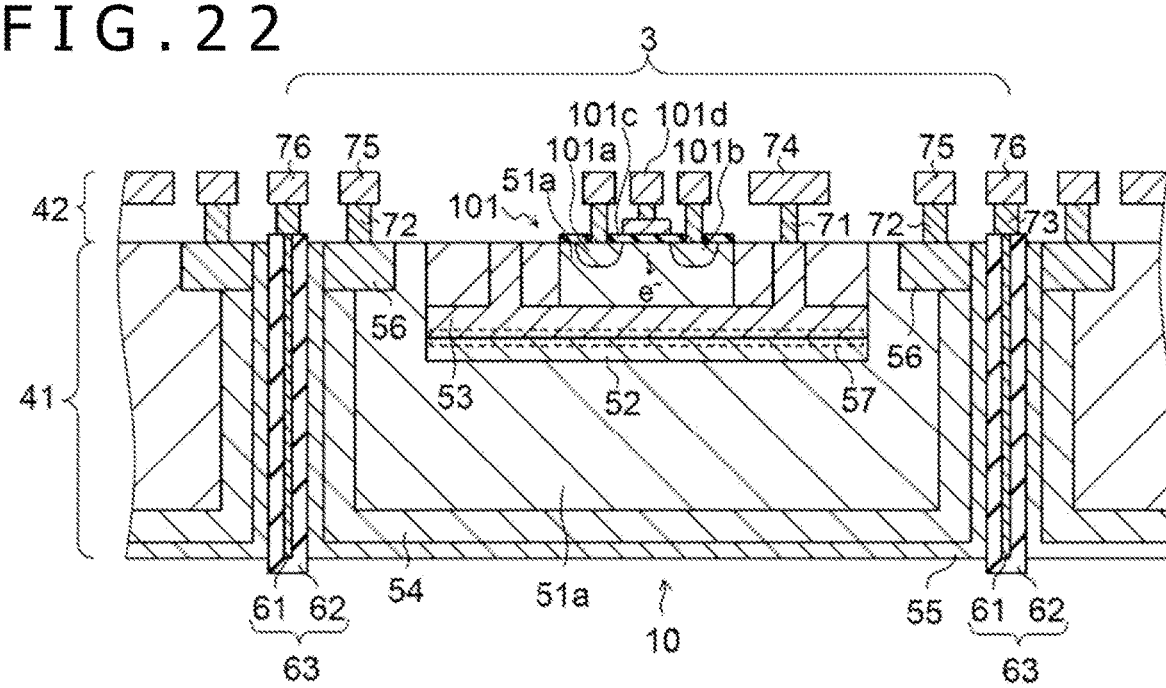
FIG. 22 is a cross-sectional diagram of a carrier generation unit according to a sixth modification of the third embodiment.

FIG. 22 is a cross-sectional diagram of the carrier generation unit 10 in a sixth modification of the third embodiment. The carrier generation unit 10 in FIG. 22 has a transistor 101 formed in the P-well 51a on the wiring layer 42 side. The transistor 101 has a drain diffusion layer 101a, a source diffusion layer 101b, and a gate insulation film 101c and a gate 101d formed between these diffusion layers and disposed above a channel. The drain diffusion layer 101a and the source diffusion layer 101b are formed by implanting impurity ions into the P-well 51a and diffusing the impurity ions.

Carriers (e.g., electrons) can be generated in a channel region by controlling a gate voltage of the transistor 101 and causing a current to flow between the drain and the source. The generated carriers are attracted toward the cathode. Accordingly, carrier detection efficiency is allowed to improve.

Figure 23:
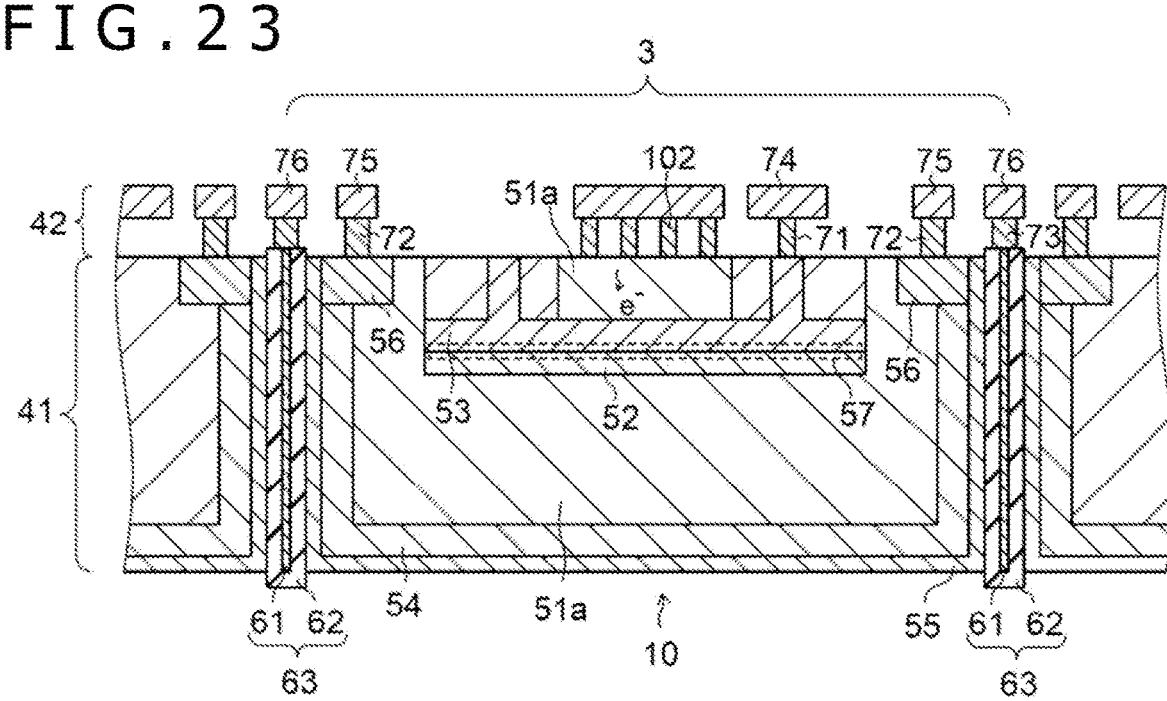
FIG. 23 is a cross-sectional diagram of a carrier generation unit according to a seventh modification of the third embodiment.

FIG. 23 is a cross-sectional diagram of the carrier generation unit 10 in a seventh modification of the third embodiment. The carrier generation unit 10 in FIG. 23 connects a contact electrode 102 to the P-well 51a on the wiring layer 42 side to apply a power source voltage to the contact electrode 102. The contact electrode 102 is formable during the step of forming the contact electrode 71 for cathode connection and the contact electrode 72 for anode connection, and hence does not require an additional manufacturing step. In this manner, carriers (e.g., electrons) can be generated in the P-well 51a on the wiring layer 42 side. The generated carriers are attracted toward the cathode. Accordingly, carrier detection efficiency is allowed to improve.

Note that a potential level applied to the contact electrode 102 may be any level. The contact electrode 102 described above may be connected to a ground node or a dedicated power source node, or may be connected to a predetermined vias voltage node or the like.

Figure 24:
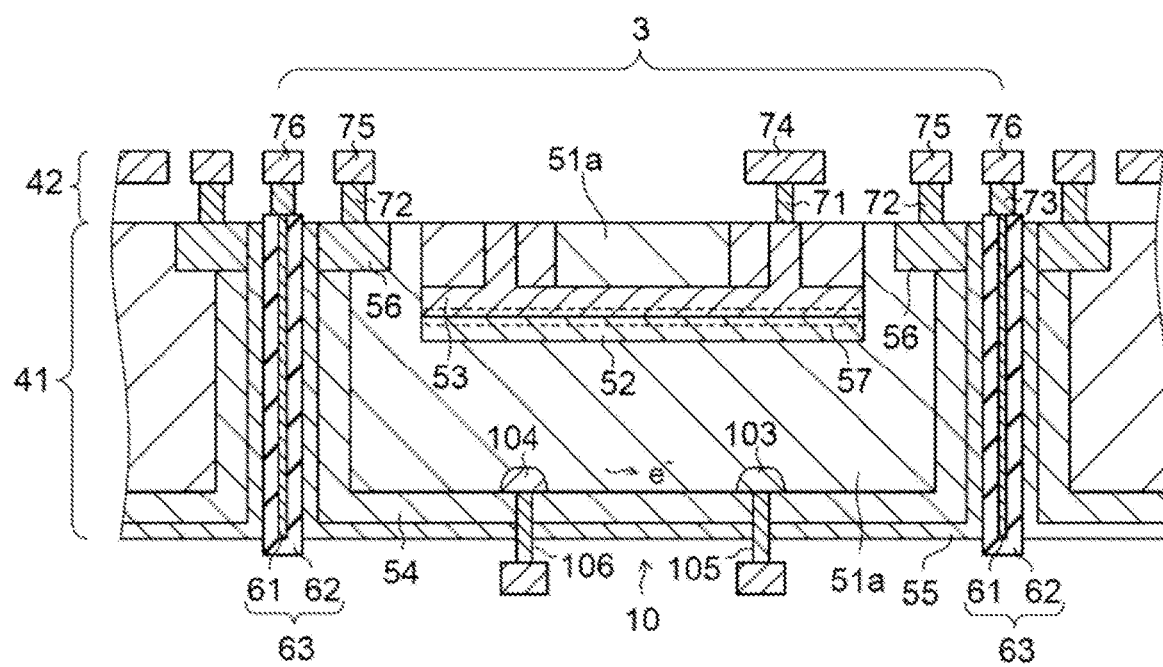
FIG. 24 is a cross-sectional diagram of a carrier generation unit according to an eighth modification of the third embodiment.

FIG. 24 is a cross-sectional diagram of the carrier generation unit 10 in an eighth modification of the third embodiment. According to the carrier generation unit 10 in FIG. 24, a P-type high concentration impurity region 103 and an N-type high concentration impurity region 104 are disposed along the end face of the P-well 51a on the side opposite to the wiring layer 42. Contact electrodes 105 and 106 are connected to the impurity regions 103 and 104 thus provided, respectively. In this configuration, a current is allowed to flow between the P-type high concentration impurity region 103 and the N-type high concentration impurity region 104 by a potential difference being given between the contact electrodes 105 and 106 thus provided. This current generates carriers, and the generated carriers (e.g., electrons) are attractable toward the cathode. Accordingly, carrier detection efficiency is allowed to improve. Any potential level may be applied to the contact electrodes 105 and 106 thus provided.

As depicted in FIGS. 16 to 24, the carrier generation unit 10 included in the monitoring pixel 3 in the third embodiment has a structure different from that of the photoelectric conversion element 9 included in the imaging pixel 2. In this manner, a carrier can be generated inside the carrier generation unit 10 by a cause other than photoelectric conversion. The generated carrier allows the carrier generation unit 10 to cause a breakdown. In this manner, a bias voltage of each of the photoelectric conversion element 9 and the carrier generation unit 10 is generable by detection of the bottom potential generated by the breakdown of the carrier generation unit 10.

Fourth Embodiment

As depicted in FIGS. 3A and 3B, the SPAD functioning as the photoelectric conversion element 9 and the carrier generation unit 10 has the avalanche multiplication region 57 which is a depletion layer formed in the region of contact between the P-type diffusion layer 52 and the N-type diffusion layer 53, and is configured to connect the cathode to the N-type diffusion layer 53 via the contact electrode 71 and connect the anode to the hole accumulation layer 54 via the contact electrode 72.

For achieving connection between the hole accumulation layer 54 on the anode side and the contact electrode 72 by ohmic junction, the high concentration P-type diffusion layer 56 needs to be provided on the end side of the hole accumulation layer 54. In addition, for achieving connection between the N-type diffusion layer 53 on the cathode side and the contact electrode 71 by ohmic junction, the N-type diffusion layer 53 needs to have a high concentration. For miniaturizing the SPAD, the distance between the anode and the cathode needs to be shortened. In this case, an intense electric field is generated between the high concentration P-type diffusion layer 56 and the N-type diffusion layer 53. When an intense electric field is generated between the high concentration P-type diffusion layer 56 and the N-type diffusion layer 53, the depletion layer is not easily formed. In this case, a carrier (electron) multiplication capability of the avalanche multiplication region 57 decreases.

According to the present embodiment, thus, connection with at least one of the electrodes on the anode side and the cathode side is made not by ohmic junction but by Schottky junction. The Schottky junction thus adopted prevents generation of an intense electric field region in the vicinity of the avalanche multiplication region 57, and hence prevents a decrease in the carrier multiplication capability of the avalanche multiplication region 57.

Figure 25A:
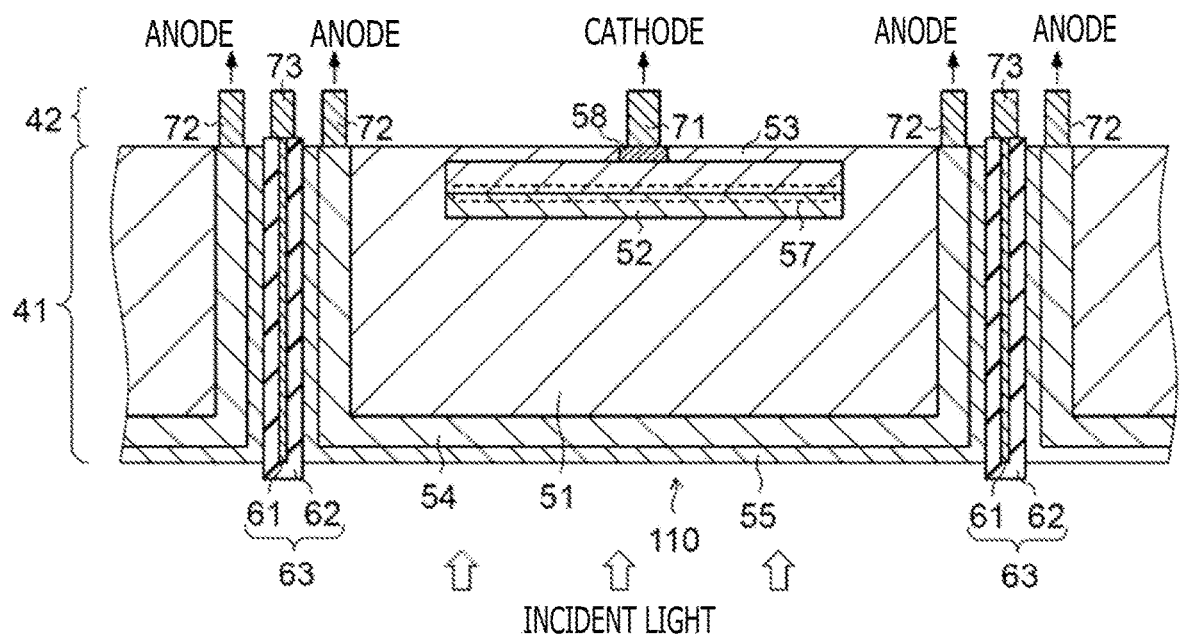
FIG. 25A is a cross-sectional diagram of a SPAD according to a fourth embodiment.

FIG. 25A is a cross-sectional diagram of a SPAD 110 according to the fourth embodiment. The SPAD 110 in FIG. 25A is applicable to both the photoelectric conversion element 9 of the imaging pixel 2 and the carrier generation unit 10 of the monitoring pixel 3. In a case where the SPAD 110 in FIG. 25A is applied to the carrier generation unit 10, such a structure which generates a carrier by a cause other than photoelectric conversion, such as partial removal of the pinning film 55, needs to be adopted as described above.

The SPAD 110 in FIG. 25A has a layer configuration similar to that of FIG. 3A. Accordingly, members identical to the corresponding members in FIG. 3A are given identical reference signs. The SPAD 110 in FIG. 25A does not have the high concentration P-type diffusion layer 56 in FIG. 3A, and the hole accumulation layer 54 is directly connected to the contact electrode 72. The hole accumulation layer 54 and the contact electrode 72 are connected to each other by Schottky junction. Meanwhile, the high concentration N-type diffusion layer 58 is disposed above the N-type diffusion layer 53. The high concentration N-type diffusion layer 58 thus provided is connected to the contact electrode 71 for cathode connection by ohmic junction.

In the configuration not including the high concentration P-type diffusion layer at the end portion of the hole accumulation layer 54 in FIG. 3A, an intense electric field region is not formed in the vicinity of this end portion. Accordingly, this configuration eliminates the possibility of the decrease in the carrier multiplication capability of the avalanche multiplication region 57.

Figure 25B:
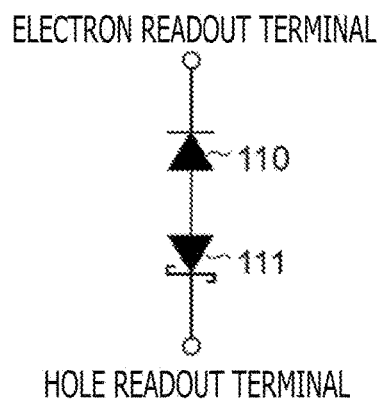
FIG. 25B is an equivalent circuit diagram of a connection portion between a hole accumulation layer and an anode in FIG. 25A.

FIG. 25B is an equivalent circuit of a connection portion between the hole accumulation layer 54 and the anode in FIG. 25A. Formed in the case of the cross-sectional structure depicted in FIG. 25A is a circuit which includes a P-type Schottky barrier diode (hereinafter referred to as an SBD) 111 connected to the anode side of the SPAD 110 as depicted in FIG. 25B. The anode of the SPAD 110 and the anode of the SBD 111 are connected to each other, while the cathode of the SBD 111 is connected to the contact electrode 72 which is a positive side readout terminal. The SBD 111 has a low forward voltage. Accordingly, connection between the hole accumulation layer 54 and the contact electrode 72 by Schottky junction has substantially no electric effect on electric characteristics of the SPAD 110.

Figure 26A:
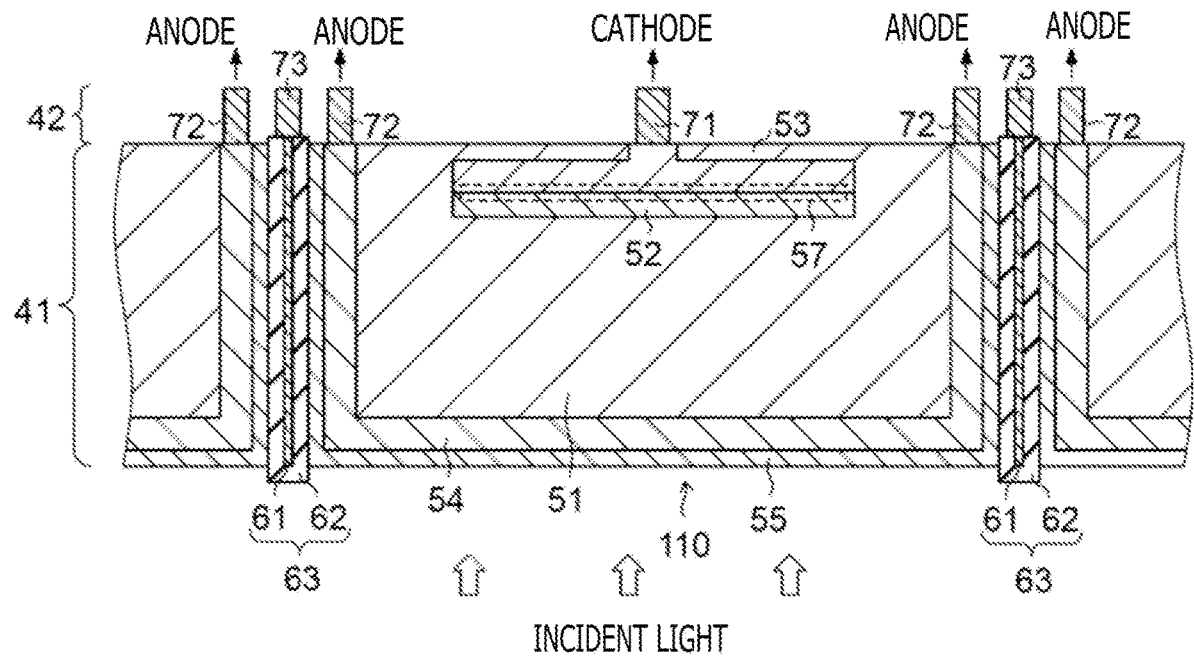
FIG. 26A is a cross-sectional diagram of a SPAD according to a first modification of the fourth embodiment.

FIG. 26A is a cross-sectional diagram of a SPAD 110 according to a first modification of the fourth embodiment. In the SPAD 110 in FIG. 26A, wiring connection of both the anode side and the cathode side is achieved by Schottky junction. In the SPAD 110 in FIG. 26A, the hole accumulation layer 54 is directly connected to the contact electrode 72, while the N-type diffusion layer 53 is directly connected to the contact electrode 71. In this manner, the hole accumulation layer 54 and the contact electrode 72 are connected by Schottky junction, while the N-type diffusion layer 53 and the contact electrode 71 are connected by Schottky junction. Accordingly, formation of an intense electric field region is avoided not only in the vicinity of the connection portion between the hole accumulation layer 54 and the contact electrode 72, but also in the vicinity of the connection portion between the N-type diffusion layer 53 and the contact electrode 71. This configuration hence eliminates the possibility of the decrease in the carrier multiplication capability of the avalanche multiplication region 57.

Figure 26B:
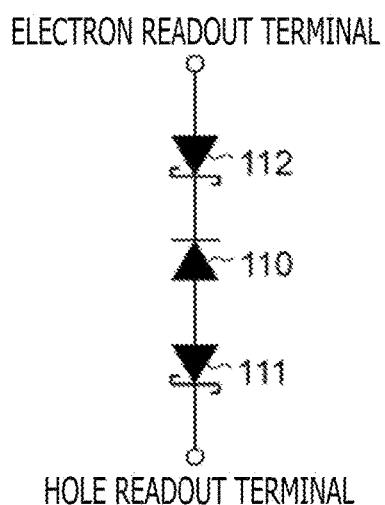
FIG. 26B is an equivalent circuit diagram of a route connecting to the SPAD in FIG. 26A.

FIG. 26B is an equivalent circuit diagram of a route connecting to the SPAD 110 in FIG. 26A. As depicted in the figure, the cathode of the P-type SBD 111 is connected to the contact electrode 72 which is a hole readout terminal, while the anode of the P-type SBD 111 is connected to the anode of the SPAD 110. The cathode of the N-type SBD 112 is connected to the cathode of the SPAD 110, while the anode of the N-type SBD 112 is connected to the contact electrode 71 which is an electron readout terminal.

Figure 27A:
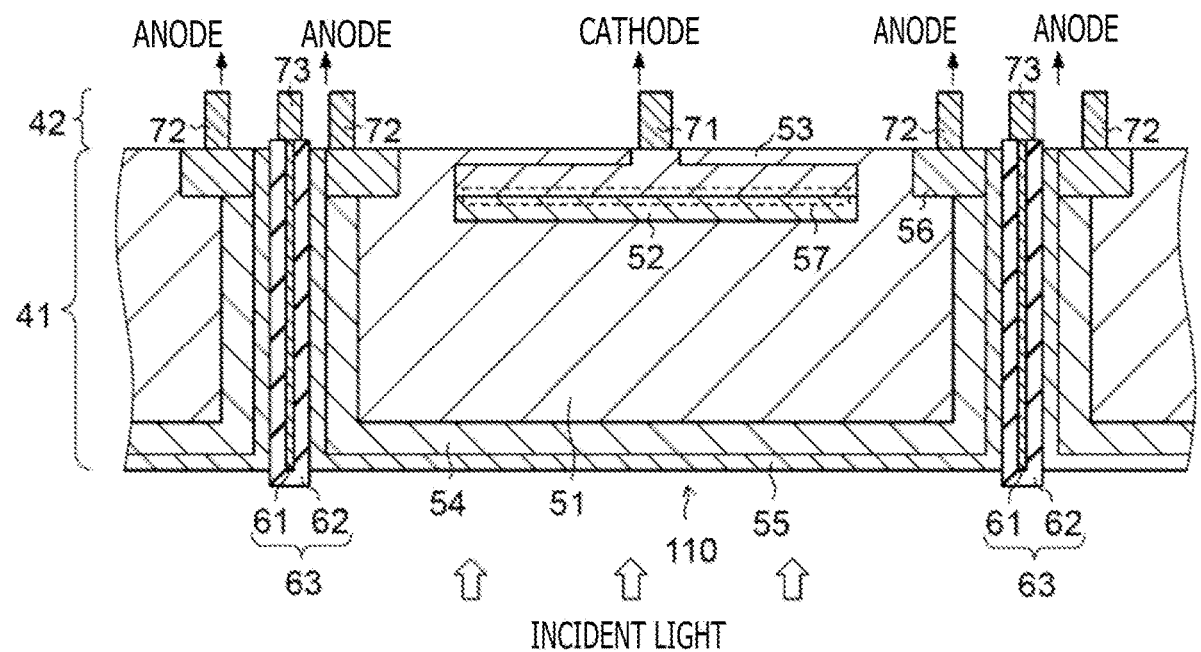
FIG. 27A is a cross-sectional diagram of a SPAD according to a second modification of the fourth embodiment.

FIG. 27A is a cross-sectional diagram of the SPAD 110 according to a second modification of the fourth embodiment. In the SPAD 110 in FIG. 27A, cathode side wiring connection is achieved by Schottky junction, while anode side wiring connection is achieved by ohmic junction. In the SPAD 110 in FIG. 27A, the high concentration P-type diffusion layer is disposed at an end portion of the hole accumulation layer 54, while the high concentration P-type diffusion layer is connected to the contact electrode 72 by ohmic junction. The N-type diffusion layer 53 is connected to the contact electrode 71 by Schottky junction. Accordingly, in the case of the SPAD 110 in FIG. 27A, formation of an intense electric field is avoided in the vicinity of the connection portion between the N-type diffusion layer 53 and the contact electrode 71. However, there is a possibility that an intense electric field is formed in the vicinity of the end portion of the hole accumulation layer 54.

Figure 27B:
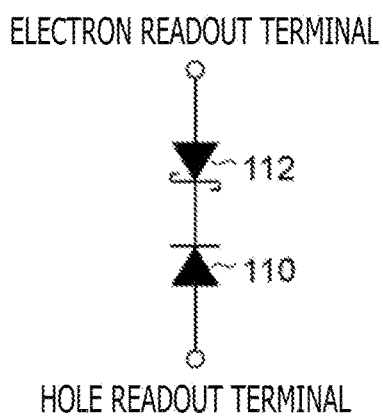
FIG. 27B is an equivalent circuit diagram of a route connecting to the SPAD in FIG. 27A.

FIG. 27B is an equivalent circuit diagram of a route connecting to the SPAD 110 in FIG. 27A. As depicted in the figure, the anode of the SPAD 110 is connected to the contact electrode 72 which is a positive side readout terminal, while the cathode of the N-type SBD 112 is connected to the cathode of the SPAD 110. The contact electrode 71 which is an electron readout terminal is connected to the anode of the N-type SBD 112.

In a case where a contact electrode including metal is formed in an n-type silicon layer, for example, the Schottky junction in each of FIGS. 25A, 26A, and 27A is achievable by connection of metal having a larger work function than 4.05 eV which is equivalent to electron affinity of silicon. It is preferable that the metal include a material forming silicide which is an alloy combined with silicon (e.g., cobalt, titanium, tantalum, and aluminum).

Dark current is easily generated in a Schottky junction region. Accordingly, carrier detection efficiency is allowed to improve by attracting carriers (e.g., electrons) generated in the Schottky junction region toward the cathode.

According to the fourth embodiment, thus, at least one of the connection between the hole accumulation layer 54 and the contact electrode 72 and the connection between the N-type diffusion layer 53 and the contact electrode 71 is achieved by Schottky junction so as not to form an intense electric field region at least either in the vicinity of the connection portion between the hole accumulation layer 54 and the contact electrode 72 or the connection portion between the N-type diffusion layer 53 and the contact electrode 71. Dark current is easily generated by adoption of Schottky junction. A carrier generated by generation of the dark current is available for the purpose of causing a breakdown of the carrier generation unit 10.

Example of Application to Mobile Body

The technology according to the present disclosure (present technology) is applicable to various products. For example, the technology according to the present disclosure may be implemented as a device mounted on any type of mobile bodies such as a car, an electric car, a hybrid electric car, a motorcycle, a bicycle, a personal mobility, an airplane, a drone, a vessel, and a robot.

Figure 28:
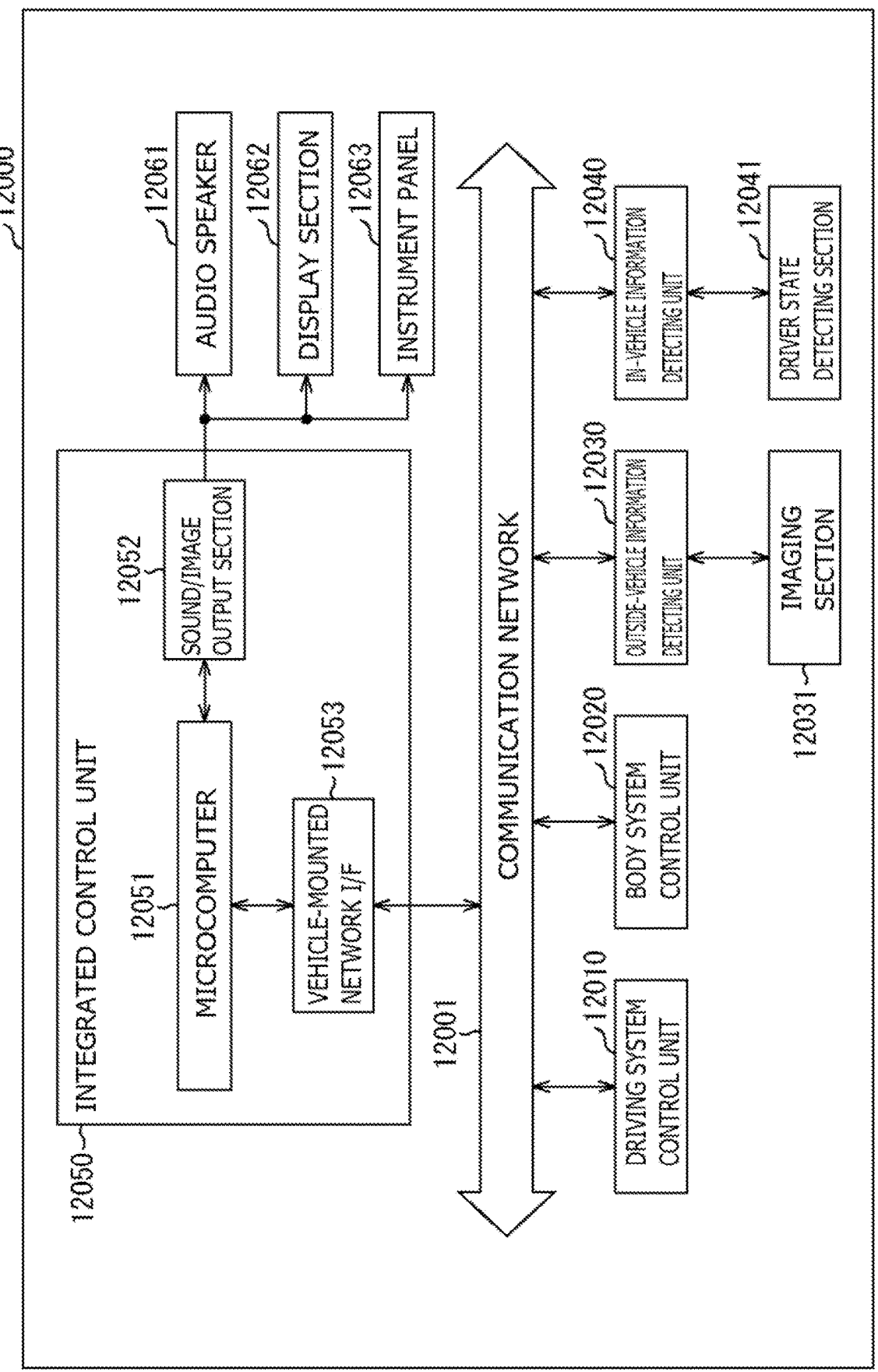
FIG. 28 is a block diagram depicting an example of schematic configuration of a vehicle control system.

FIG. 28 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 28, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 28, an audio speaker 12061, a display section 12062, and an instrument panel 12063 are illustrated as the output device. The display section 12062 may, for example, include at least one of an on-board display and a head-up display.

Figure 29:
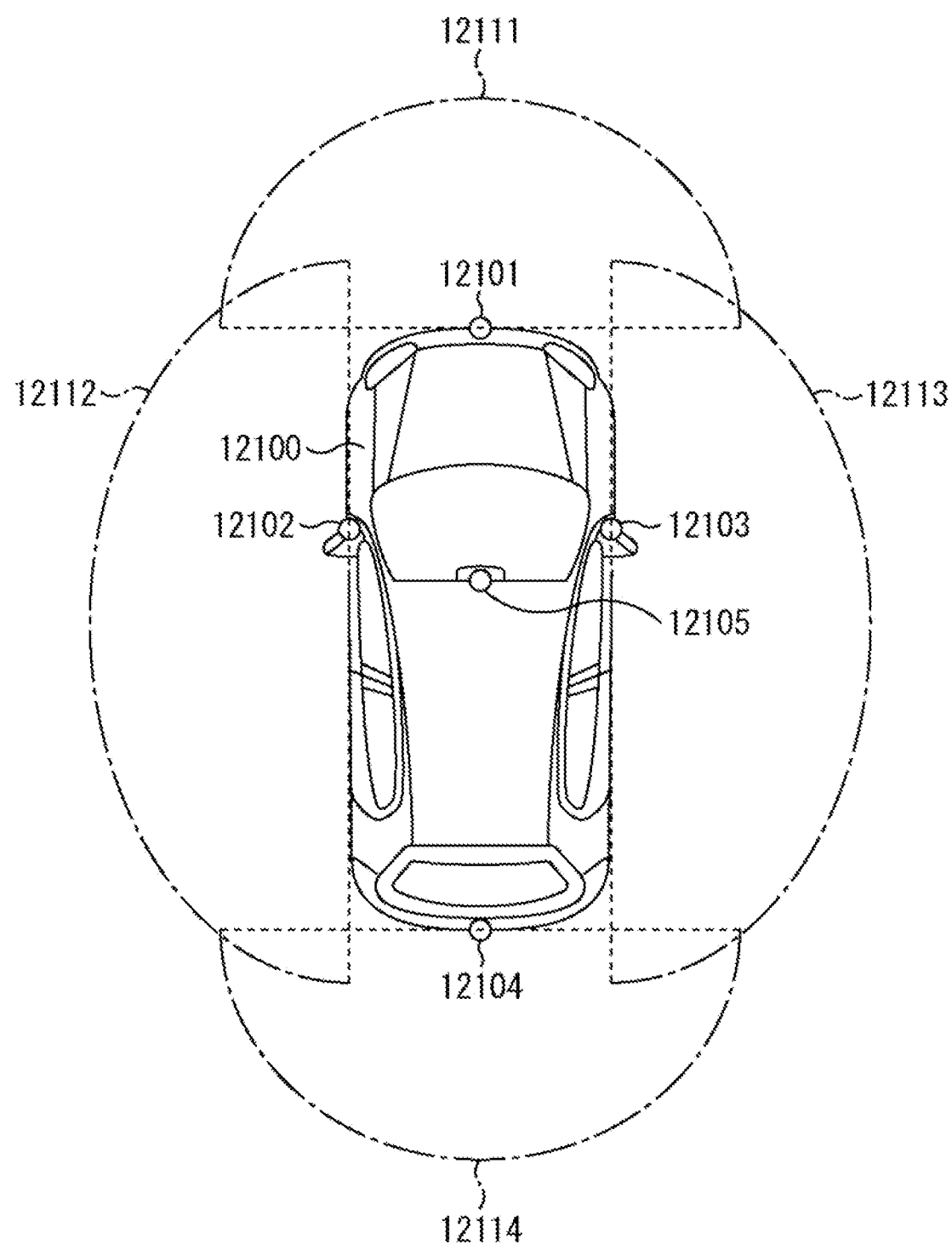
FIG. 29 is a diagram of assistance in explaining an example of installation positions of an outside-vehicle information detecting section and an imaging section.

FIG. 29 is a diagram depicting an example of the installation position of the imaging section 12031.

In FIG. 29, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 29 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Described above has been one example of the vehicle control system to which the technology according to the present disclosure is applicable. The technology according to the present disclosure is applicable to the imaging section 12031 and the like included in the configuration described above. Specifically, the optical detection device 1 of the present disclosure is applicable to the imaging section 12031. Applying the technology of the present disclosure to the imaging section 12031 makes it possible to acquire clearer captured images. Accordingly, fatigue of the driver can be reduced.

Note that the present technology can take the following configurations.

(1)
  An optical detection device including:
    a first pixel that has a photoelectric conversion element for generating a carrier by photoelectric conversion;
    a second pixel that has a carrier generation unit for generating a carrier by a cause other than photoelectric conversion; and
    a control circuit that controls a bias voltage applied to each of the photoelectric conversion element and the carrier generation unit, according to the carrier generated by the second pixel,
  in which the photoelectric conversion element includes
    a first photoelectric conversion region in which photoelectric conversion is possible, and
    a first pinning film disposed at a position in contact with the first photoelectric conversion region, and
  the carrier generation unit includes a second photoelectric conversion region in which photoelectric conversion is possible, and includes a second pinning film that is partially removed, at a position in contact with the second photoelectric conversion region, or no member that reduces dark current, in an entire area of the second photoelectric conversion region.

(2)
  The optical detection device according to (1), in which the second pinning film is partially removed from at least either a surface side opposite to a wiring region of the carrier generation unit or a boundary region with an adjacent pixel.

(3)
  The optical detection device according to (1) or (2), in which the carrier generation unit generates the carrier by an interface state produced inside the second photoelectric conversion region.

(4)
  The optical detection device according to any one of (1) to (3), including:
    a light shielding member that shields entrance of light into the second pixel.

(5)
  The optical detection device according to (4), in which a material of the light shielding member contains a material identical to a material of a pixel separator that is disposed in a boundary region of the second pixel and that shields light coming from an adjacent pixel.

(6)
  The optical detection device according to (4) or (5), including:
    an on-chip lens that converges light to the first pixel; and
    a light emission element that emits light,
    in which the second pixel is disposed at a position different from a region through which light emitted from the light emission element passes and a region through which light transmitted through the on-chip lens passes.

(7)
  The optical detection device according to (6), including:
    a support that supports the first pixel, the second pixel, the on-chip lens, and the light emission element,
    in which a part of the support functions as the light shielding member.

(8)
  The optical detection device according to any one of (1) through (7), in which
    the carrier generation unit has a P-region and an N-region joined to each other, and
    the carrier generation unit causes a breakdown when the carrier is generated in a state where a potential difference corresponding to the bias voltage is given between the P-region and the N-region.

(9)
  The optical detection device according to (8), including:
    a readout circuit that generates a pixel signal corresponding to the carrier generated by the second pixel,
    in which the control circuit controls the bias voltage in reference to a potential level of the pixel signal.

(10)
  The optical detection device according to (9), including:
    a count circuit that counts the number of times the carrier generation unit has caused a breakdown; and
    a number of times comparison and determination circuit that determines whether or not the number of times counted by the count circuit has reached a predetermined reference number of times, and changes an operation condition for the second pixel according to a determination that the counted number of times has reached the reference number of times.

(11)
  The optical detection device according to (10), in which the number of times comparison and determination circuit controls the potential difference to prevent a breakdown of the carrier generation unit when the counted number of times has reached the reference number of times.

(12)
  The optical detection device according to (10) or (11), in which the control circuit, the readout circuit, the count circuit, and the number of times comparison and determination circuit are provided for each unit of the second pixel or of a plurality of the second pixels.

(13)

The optical detection device according to any one of (10) to (12), in which the control circuit, the readout circuit, the count circuit, and the number of times comparison and determination circuit are disposed on a substrate identical to a substrate where the first pixel and the second pixel are disposed.

(14)

The optical detection device according to any one of (10) to (12), including:
- a first substrate where the first pixel and the second pixel are disposed; and
- a second substrate where at least some of the control circuit, the readout circuit, the count circuit, and the number of times comparison and determination circuit are disposed,
- in which the first substrate and the second substrate are laminated and joined by a conductive member to perform signal transfer between each other.

(15)

The optical detection device according to any one of (1) to (14), including:
- a pixel array unit that has a plurality of the first pixels and a plurality of the second pixels,
- in which the plurality of first and second pixels are provided such that each of the plurality of first pixels is associated with any one of the second pixels, that each of the second pixels is associated with any two or more of the first pixels, or that each of the first pixels is associated with any two or more of the second pixels.

(16)

The optical detection device according to (15), in which the pixel array unit is formed such that the pixel array unit includes a first pixel region where the plurality of first pixels are disposed and a second pixel region where the plurality of second pixels are disposed, that the plurality of second pixels are disposed within a pixel region where the plurality of the first pixels are disposed, or that the plurality of first pixels are disposed within a pixel region where the plurality of second pixels are disposed.

(17)

An optical detection device including:
- a first pixel that has a photoelectric conversion element for generating a carrier by photoelectric conversion;
- a second pixel that has a carrier generation unit different from the photoelectric conversion element in structure for generating a carrier; and
- a control circuit that controls a bias voltage applied to each of the photoelectric conversion element and the carrier generation unit, according to the carrier generated by the second pixel.

(18)

The optical detection device according to (17), in which
- the photoelectric conversion element has a first photoelectric conversion region in which photoelectric conversion is possible,
- the carrier generation unit has a second photoelectric conversion region in which photoelectric conversion is possible, and
- the second photoelectric conversion region has a carrier generation source that generates the carrier by a cause other than entrance of light.

(19)

The optical detection device according to (18), in which the carrier generation source includes a diffusion region in a floating state that is disposed inside the second photoelectric conversion region and that has a higher impurity concentration than the second photoelectric conversion region.

(20)

The optical detection device according to (18) or (19), in which the carrier generation source includes at least either a crystal defect portion or a heavy metal existing portion inside the second photoelectric conversion region.

(21)

The optical detection device according to any one of (18) to (20), in which the carrier generation source includes a portion obtained by partially removing a surface of the second photoelectric conversion region.

(22)

The optical detection device according to any one of (18) to (21), in which the carrier generation source includes a conductive member that is in a floating state and is connected to the second photoelectric conversion region.

(23)

The optical detection device according to any one of (18) to (22), in which
- the carrier generation unit has a stress applying member that applies stress to the second photoelectric conversion region, and
- the carrier generation source includes a portion distorted by the stress applied from the stress applying member within the second photoelectric conversion region.

(24)

The optical detection device according to any one of (18) to (23), in which
- the carrier generation unit has a transistor disposed in the second photoelectric conversion region, and
- the carrier generation source generates the carrier by controlling a gate voltage of the transistor.

(25)

The optical detection device according to any one of (18) to (24), in which
- the carrier generation unit has an electrode connected to the second photoelectric conversion region, and
- the carrier generation source generates the carrier by applying a predetermined voltage to the electrode.

(26)

The optical detection device according to any one of (18) to (25), in which
- the second photoelectric conversion region has a plurality of diffusion layers disposed with a distance left between each other in a plane direction, and
- the carrier generation source generates the carrier that moves between the plurality of diffusion layers, by giving a potential difference between the plurality of diffusion layers.

(27)

The optical detection device according to any one of (18) to (24), in which
- the carrier generation unit includes
  - a first semiconductor layer of a first conductivity type,
  - a second semiconductor layer of a second conductivity type that is so disposed as to come into contact with the first semiconductor layer and configured to multiply the carrier,
  - a third semiconductor layer of the second conductivity type that is so disposed as to surround at least a part of the first semiconductor layer and the second semiconductor layer,
  - a first contact electrode provided for cathode connection and connected to the first semiconductor layer, and a second contact electrode provided for anode connection and connected to the third semiconductor layer, at least either connection between the first contact electrode and the first semiconductor layer or connection between the second contact electrode and the third semiconductor layer is made by Schottky junction, and the carrier generation source includes a portion joined by the Schottky junction.

(28)

The optical detection device according to any one of (18) to (27), in which the carrier generation source includes a portion from which at least a part of a pinning film disposed in the second photoelectric conversion region has been removed.

(29)

The optical detection device according to (28), in which the pinning film is partially removed from at least either a surface side opposite to a wiring region of the carrier generation unit or a boundary region with an adjacent pixel.

(30)

The optical detection device according to any one of (27) to (29), in which the carrier generation unit generates the carrier by an interface state produced inside the second photoelectric conversion region.

(31)

The optical detection device according to any one of (27) to (30), including:

a light shielding member that shields entrance of light into the second pixel.

(32)

The optical detection device according to (31), in which a material of the light shielding member contains a material identical to a material of a pixel separator that is disposed in a boundary region of the second pixel and that shields light coming from an adjacent pixel.

(33)

The optical detection device according to (31) or (32), including:

an on-chip lens that converges light to the first pixel; and a light emission element that emits light, in which the second pixel is disposed at a position different from a region through which light emitted from the light emission element passes and a region through which light transmitted through the on-chip lens passes.

(34)

The optical detection device according to (33), including:

a support that supports the first pixel, the second pixel, the on-chip lens, and the light emission element, in which a part of the support functions as the light shielding member.

(35)

The optical detection device according to any one of (27) to (34), in which the carrier generation unit has a P-region and an N-region joined to each other, and the carrier generation unit causes a breakdown when the carrier is generated in a state where a potential difference corresponding to the bias voltage is given between the P-region and the N-region.

(36)

The optical detection device according to (35), including:

a readout circuit that generates a pixel signal corresponding to the carrier generated by the second pixel, in which the control circuit controls the bias voltage in reference to a potential level of the pixel signal.

(37)

The optical detection device according to (36), including:

a count circuit that counts the number of times the carrier generation unit has caused a breakdown; and a number of times comparison and determination circuit that determines whether or not the number of times counted by the count circuit has reached a predetermined reference number of times, and changes an operation condition for the second pixel according to a determination that the counted number of times has reached the reference number of times.

(38)

The optical detection device according to (37), in which the number of times comparison and determination circuit controls the potential difference to prevent a breakdown of the carrier generation unit when the counted number of times has reached the reference number of times.

(39)

The optical detection device according to (37) or (38), in which the control circuit, the readout circuit, the count circuit, and the number of times comparison and determination circuit are provided for each unit of the single second pixel or of a plurality of the second pixels.

(40)

The optical detection device according to any one of (37) to (39), in which the control circuit, the readout circuit, the count circuit, and the number of times comparison and determination circuit are disposed on a substrate identical to a substrate where the first pixel and the second pixel are disposed.

(41)

The optical detection device according to any one of (37) to (39), including:

a first substrate where the first pixel and the second pixel are disposed; and a second substrate where at least some of the control circuit, the readout circuit, the count circuit, and the number of times comparison and determination circuit are disposed, in which the first substrate and the second substrate are laminated and joined by a conductive member to perform signal transfer between each other.

(42)

The optical detection device according to any one of (27) to (41), including:

a pixel array unit that has a plurality of the first pixels and a plurality of the second pixels, in which the plurality of first and second pixels are provided such that each of the plurality of first pixels is associated with any one of the second pixels, that each of the second pixels is associated with any two or more of the first pixels, or that each of the first pixels is associated with any two or more of the second pixels.

(43)

The optical detection device according to (42), in which the pixel array unit is formed such that the pixel array unit includes a first pixel region where the plurality of first pixels are disposed and a second pixel region where the plurality of second pixels are disposed, that the plurality of second pixels are disposed within a pixel region where the plurality of first pixels are disposed, or that the plurality of first pixels are disposed within a pixel region where the plurality of second pixels are disposed.

(44)

An electronic apparatus including:

an optical detection device that outputs a pixel signal corresponding to a carrier generated by photoelectric conversion; and a signal processing unit that performs predetermined signal processing for the pixel signal, in which
the optical detection device includes
a first pixel that has a photoelectric conversion element for generating a carrier by photoelectric conversion,
a second pixel that has a carrier generation unit for generating a carrier by a cause other than photoelectric conversion, and
a control circuit that controls a bias voltage applied to each of the photoelectric conversion element and the carrier generation unit, according to the carrier generated by the second pixel,
the photoelectric conversion element includes
a first photoelectric conversion region in which photoelectric conversion is possible, and
a first pinning film disposed at a position in contact with the first photoelectric conversion region, and
the carrier generation unit includes a second photoelectric conversion region in which photoelectric conversion is possible, and includes a second pinning film that is partially removed, at a position in contact with the second photoelectric conversion region, or no member that reduces dark current, in an entire area of the second photoelectric conversion region.

(45) An electronic apparatus including:
an optical detection device that outputs a pixel signal corresponding to a carrier generated by photoelectric conversion; and
a signal processing unit that performs predetermined signal processing for the pixel signal,
in which the optical detection device includes
a first pixel that has a photoelectric conversion element for generating a carrier by photoelectric conversion,
a second pixel that has a carrier generation unit different from the photoelectric conversion element in structure for generating a carrier, and
a control circuit that controls a bias voltage applied to each of the photoelectric conversion element and the carrier generation unit, according to the carrier generated by the second pixel.

Modes of the present disclosure are not limited to the individual embodiments described above, and include various modifications which may be arrived at by those skilled in the art. In addition, advantageous effects of the present disclosure are not limited to the specific contents of the advantageous effects described above. Accordingly, various additions, changes, and partial deletions may be made without departing from the scope of the conceptual idea and spirit of the present disclosure derived from the contents specified in the claims and equivalents of these.

REFERENCE SIGNS LIST

1: Optical detection device
2: Imaging pixel
2a: On-chip lens
3: Monitoring pixel
4: First readout circuit
5: Second readout circuit
6: Count circuit
7: Number of times comparison and determination circuit
8: Control circuit
8a: Anode voltage control circuit
9: Photoelectric conversion element
10: Carrier generation unit
11: PMOS transistor
12: Inverter
13: PMOS transistor
13a: Current source
13b: Current source
14: Buffer
15: Timing detection circuit
16: Sample hold circuit
17: Buffer
21: Pixel average acquisition unit
22: Time acquisition unit
23: Potential control unit
25: Light shielding member
26: ToF sensor
27: Light emission unit
28: Light reception unit
29: Support member
30: Light shielding wall
31: Converging lens (light reception side optical system)
32: Dummy pixel
33: Drive unit
34: Power source circuit
35: Light emission side optical system
36: Signal processing unit
37: Control unit
38: Temperature detection unit
39: Distance measuring unit
40: Distance measuring device
41: Sensor substrate
42: Wiring layer (sensor side wiring layer)
43: Logic side wiring layer
45: Pixel array unit
45a: First pixel array unit
45b: Second pixel array unit
46: SPAD pixel
47: Readout circuit
48: Determination circuit
49a: First substrate
49b: Second substrate
51: N-well
51a: P-well
52: P-type diffusion layer
53: N-type diffusion layer
54: Hole accumulation layer
55: Pinning film
55a: Removal portion
55b: Interface state
56: High concentration P-type diffusion layer
57: Avalanche multiplication region
58: High concentration N-type diffusion layer
61: Metal film
62: Insulation film
63: Pixel separation portion
64: High concentration impurity region
65: Recessed and protruded structure
66: Crystal defect
67: Heavy metal
68: Contact electrode
69: Stress applying member
71: Contact electrode
72: Direct contact electrode
72: Contact electrode
73: Contact electrode
74: Metal wire
75: Metal wire
76: Metal wire
77: Contact electrode
78: Contact electrode 79: Contact electrode
80: Metal pad
81: Metal pad
82: Metal pad
83: Electrode pad
84: Electrode pad
85: Electrode pad
86: Insulation layer
87: Contact electrode
88: Contact electrode
89: Contact electrode
90: Contact electrode
91: Contact electrode
92: Contact electrode
93: Metal pad
94: Metal pad
95: Metal pad
101: Transistor
101a: Diffusion layer
101b: Diffusion layer
101c: Gate insulation film
101d: Gate
102: Contact electrode
103: P-type high concentration impurity region
104: N-type high concentration impurity region
105: Contact electrode
106: Contact electrode
111 Schottky barrier diode

The invention claimed is:

1. An optical detection device comprising:
a first pixel that has a photoelectric conversion element for generating a carrier by photoelectric conversion;
a second pixel that has a carrier generation unit for generating a carrier by a cause other than photoelectric conversion; and
a control circuit that controls a bias voltage applied to each of the photoelectric conversion element and the carrier generation unit, according to the carrier generated by the second pixel,
wherein the photoelectric conversion element includes a first photoelectric conversion region in which photoelectric conversion is possible, and a first pinning film disposed at a position in contact with the first photoelectric conversion region, and
the carrier generation unit includes a second photoelectric conversion region in which photoelectric conversion is possible, and includes a second pinning film that is partially removed, at a position in contact with the second photoelectric conversion region, or no member that reduces dark current, in an entire area of the second photoelectric conversion region.

2. The optical detection device according to claim 1, wherein the second pinning film is partially removed from at least either a surface side opposite to a wiring region of the carrier generation unit or a boundary region with an adjacent pixel.

3. The optical detection device according to claim 1, wherein the carrier generation unit generates the carrier by an interface state produced inside the second photoelectric conversion region.

4. The optical detection device according to claim 1, comprising:
a light shielding member that shields entrance of light into the second pixel.

5. The optical detection device according to claim 4, wherein a material of the light shielding member contains a material identical to a material of a pixel separator that is disposed in a boundary region of the second pixel and that shields light coming from an adjacent pixel.

6. The optical detection device according to claim 4, comprising:
an on-chip lens that converges light to the first pixel; and
a light emission element that emits light,
wherein the second pixel is disposed at a position different from a region through which light emitted from the light emission element passes and a region through which light transmitted through the on-chip lens passes.

7. The optical detection device according to claim 6, comprising:
a support that supports the first pixel, the second pixel, the on-chip lens, and the light emission element, wherein a part of the support functions as the light shielding member.

8. The optical detection device according to claim 1, wherein
the carrier generation unit has a P-region and an N-region joined to each other, and
the carrier generation unit causes a breakdown when the carrier is generated in a state where a potential difference corresponding to the bias voltage is given between the P-region and the N-region.

9. The optical detection device according to claim 8, comprising:
a readout circuit that generates a pixel signal corresponding to the carrier generated by the second pixel,
wherein the control circuit controls the bias voltage in reference to a potential level of the pixel signal.

10. The optical detection device according to claim 9, comprising:
a count circuit that counts the number of times the carrier generation unit has caused a breakdown; and
a number of times comparison and determination circuit that determines whether or not the number of times counted by the count circuit has reached a predetermined reference number of times, and changes an operation condition for the second pixel according to a determination that the counted number of times has reached the reference number of times.

11. The optical detection device according to claim 10, wherein the number of times comparison and determination circuit controls the potential difference to prevent a breakdown of the carrier generation unit when the counted number of times has reached the reference number of times.

12. The optical detection device according to claim 10, wherein the control circuit, the readout circuit, the count circuit, and the number of times comparison and determination circuit are provided for each unit of the second pixel or of a plurality of the second pixels.

13. The optical detection device according to claim 10, wherein the control circuit, the readout circuit, the count circuit, and the number of times comparison and determination circuit are disposed on a substrate identical to a substrate where the first pixel and the second pixel are disposed.

14. The optical detection device according to claim 10, comprising:
a first substrate where the first pixel and the second pixel are disposed; and
a second substrate where at least some of the control circuit, the readout circuit, the count circuit, and the number of times comparison and determination circuit are disposed, wherein the first substrate and the second substrate are laminated and joined by a conductive member to perform signal transfer between each other.

15. The optical detection device according to claim 1, comprising:
a pixel array unit that has a plurality of the first pixels and a plurality of the second pixels,
wherein the plurality of first and second pixels are provided such that each of the plurality of first pixels is associated with any one of the second pixels, that each of the second pixels is associated with any two or more of the first pixels, or that each of the first pixels is associated with any two or more of the second pixels.

16. The optical detection device according to claim 15, wherein the pixel array unit is formed such that the pixel array unit includes a first pixel region where the plurality of first pixels are disposed and a second pixel region where the plurality of second pixels are disposed, that the plurality of second pixels are disposed within a pixel region where the plurality of the first pixels are disposed, or that the plurality of first pixels are disposed within a pixel region where the plurality of second pixels are disposed.

17. An optical detection device comprising:
a first pixel that has a photoelectric conversion element for generating a carrier by photoelectric conversion;
a second pixel that has a carrier generation unit different from the photoelectric conversion element in structure for generating a carrier; and
a control circuit that controls a bias voltage applied to each of the photoelectric conversion element and the carrier generation unit, according to the carrier generated by the second pixel, wherein
the photoelectric conversion element has a first photoelectric conversion region in which photoelectric conversion is possible,
the carrier generation unit has a second photoelectric conversion region in which photoelectric conversion is possible,
the second photoelectric conversion region has a carrier generation source that generates the carrier by a cause other than entrance of light, and
the carrier generation source includes a diffusion region that is arranged to be in a floating state, that is disposed inside the second photoelectric conversion region, and that has a higher impurity concentration than the second photoelectric conversion region.

18. The optical detection device according to claim 17, wherein the carrier generation source includes at least either a crystal defect portion or a heavy metal existing portion inside the second photoelectric conversion region.

19. The optical detection device according to claim 17, wherein the carrier generation source includes a portion obtained by partially removing a surface of the second photoelectric conversion region.

20. The optical detection device according to claim 17, wherein
the carrier generation unit has a stress applying member that applies stress to the second photoelectric conversion region, and
the carrier generation source includes a portion distorted by the stress applied from the stress applying member within the second photoelectric conversion region.

21. The optical detection device according to claim 17, wherein
the carrier generation unit has a transistor disposed in the second photoelectric conversion region, and
the carrier generation source generates the carrier by controlling a gate voltage of the transistor.

22. The optical detection device according to claim 17, wherein
the carrier generation unit has an electrode connected to the second photoelectric conversion region, and
the carrier generation source generates the carrier by applying a predetermined voltage to the electrode.

23. The optical detection device according to claim 17, wherein
the second photoelectric conversion region has a plurality of diffusion layers disposed with a distance left between each other in a plane direction, and
the carrier generation source generates the carrier that moves between the plurality of diffusion layers, by giving a potential difference between the plurality of diffusion layers.

24. The optical detection device according to claim 17, wherein
the carrier generation unit includes
a first semiconductor layer of a first conductivity type,
a second semiconductor layer of a second conductivity type that is so disposed as to come into contact with the first semiconductor layer and configured to multiply the carrier,
a third semiconductor layer of the second conductivity type that is so disposed as to surround at least a part of the first semiconductor layer and the second semiconductor layer,
a first contact electrode provided for cathode connection and connected to the first semiconductor layer, and
a second contact electrode provided for anode connection and connected to the third semiconductor layer,
at least either connection between the first contact electrode and the first semiconductor layer or connection between the second contact electrode and the third semiconductor layer is made by Schottky junction, and
the carrier generation source includes a portion joined by the Schottky junction.

25. An optical detection device comprising:
a first pixel that has a photoelectric conversion element for generating a carrier by photoelectric conversion;
a second pixel that has a carrier generation unit different from the photoelectric conversion element in structure for generating a carrier; and
a control circuit that controls a bias voltage applied to each of the photoelectric conversion element and the carrier generation unit, according to the carrier generated by the second pixel, wherein
the photoelectric conversion element has a first photoelectric conversion region in which photoelectric conversion is possible,
the carrier generation unit has a second photoelectric conversion region in which photoelectric conversion is possible,
the second photoelectric conversion region has a carrier generation source that generates the carrier by a cause other than entrance of light, and
the carrier generation source includes a conductive member that is arranged to be in a floating state and that is connected to the second photoelectric conversion region.

26. An electronic apparatus comprising:
an optical detection device that outputs a pixel signal corresponding to a carrier generated by photoelectric conversion; and a signal processing unit that performs predetermined signal processing for the pixel signal,
wherein
the optical detection device includes
a first pixel that has a photoelectric conversion element for generating a carrier by photoelectric conversion,
a second pixel that has a carrier generation unit for generating a carrier by a cause other than photoelectric conversion, and
a control circuit that controls a bias voltage applied to each of the photoelectric conversion element and the carrier generation unit, according to the carrier generated by the second pixel,
the photoelectric conversion element includes
a first photoelectric conversion region in which photoelectric conversion is possible, and
a first pinning film disposed at a position in contact with the first photoelectric conversion region, and
the carrier generation unit includes a second photoelectric conversion region in which photoelectric conversion is possible, and includes a second pinning film that is partially removed, at a position in contact with the second photoelectric conversion region, or no member that reduces dark current, in an entire area of the second photoelectric conversion region.

* * * * *